(12) United States Patent
Kwon

(10) Patent No.: US 9,811,122 B2
(45) Date of Patent: Nov. 7, 2017

(54) PACKAGE ON PACKAGES AND MOBILE COMPUTING DEVICES HAVING THE SAME

(71) Applicant: Heung Kyu Kwon, Seongnam-Si (KR)

(72) Inventor: Heung Kyu Kwon, Seongnam-Si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 8 days.

(21) Appl. No.: 14/955,281

(22) Filed: Dec. 1, 2015

(65) Prior Publication Data

US 2016/0161992 A1 Jun. 9, 2016

(30) Foreign Application Priority Data

Dec. 5, 2014 (KR) ........................ 10-2014-0173629

(51) Int. Cl.
*H01L 23/02* (2006.01)
*G06F 1/16* (2006.01)
(Continued)

(52) U.S. Cl.
CPC ............ *G06F 1/1658* (2013.01); *H01L 23/48* (2013.01); *H01L 23/49811* (2013.01); *H01L 23/5383* (2013.01); *H01L 25/0655* (2013.01); *H01L 25/0657* (2013.01); *H01L 25/105* (2013.01); *H01L 23/3128* (2013.01); *H01L 23/49816* (2013.01); *H01L 25/18* (2013.01); *H01L 2224/16227* (2013.01); *H01L 2224/16235* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/48235* (2013.01); *H01L 2224/73204* (2013.01); *H01L 2224/73253* (2013.01); *H01L 2224/73265* (2013.01); *H01L 2224/92125* (2013.01); *H01L 2225/0651* (2013.01); *H01L 2225/06506* (2013.01); *H01L 2225/06517* (2013.01); *H01L 2225/06558* (2013.01); *H01L 2225/06562* (2013.01); *H01L 2225/1023* (2013.01); *H01L 2225/1058* (2013.01); *H01L 2924/1434* (2013.01); *H01L 2924/1436* (2013.01); *H01L 2924/1437* (2013.01); *H01L 2924/1438* (2013.01); *H01L 2924/15192* (2013.01);
(Continued)

(58) Field of Classification Search
CPC . H01L 2224/16145; H01L 2225/06517; H01L 25/0657; H01L 2924/10105; H01L 23/49816; H01L 2225/1023; H01L 23/488
USPC ....................................... 257/686, 777, 778
See application file for complete search history.

(56) References Cited

U.S. PATENT DOCUMENTS 8,115,291 B2  2/2012  Baek et al.
8,698,301 B2  4/2014  Kwon et al.
(Continued)

*Primary Examiner* — S. V. Clark
(74) *Attorney, Agent, or Firm* — Harness, Dickey & Pierce, P.L.C.

(57) ABSTRACT

A package on package may include: a first printed circuit board (PCB); a bottom package which includes a first chip die and a second chip die attached to the first PCB; a top package which includes a second PCB and a third chip die attached to the second PCB, and is overlaid over the bottom package; and/or first stack connection solder balls and second stack connection solder balls which are electrically connected between the first PCB and the second PCB, and are formed only around two sides facing each other among sides of the bottom package.

16 Claims, 25 Drawing Sheets

(51) Int. Cl.
  *H01L 23/48* (2006.01)
  *H01L 23/498* (2006.01)
  *H01L 23/538* (2006.01)
  *H01L 25/10* (2006.01)
  *H01L 25/065* (2006.01)
  *H01L 23/31* (2006.01)
  *H01L 25/18* (2006.01)

(52) U.S. Cl.
  CPC ............... *H01L 2924/15311* (2013.01); *H01L 2924/15331* (2013.01)

(56) References Cited

U.S. PATENT DOCUMENTS

| | | |
|---|---|---|
| 8,791,559 B2 | 7/2014 | Kim et al. |
| 8,952,517 B2 | 2/2015 | Kwon et al. |
| 2005/0248010 A1* | 11/2005 | Ono .................. H01L 23/13 257/678 |
| 2006/0049504 A1* | 3/2006 | Corisis ............. H01L 23/49816 257/686 |
| 2010/0052132 A1* | 3/2010 | Baek ................ H01L 23/49816 257/686 |
| 2010/0148342 A1* | 6/2010 | Kawabata ........... H01L 25/0652 257/686 |
| 2010/0155919 A1* | 6/2010 | Song .................. H01L 23/5387 257/686 |
| 2011/0013353 A1 | 1/2011 | Kwon et al. |
| 2011/0316119 A1* | 12/2011 | Kim ...................... H01G 2/065 257/532 |
| 2013/0087911 A1 | 4/2013 | Gregorich et al. |
| 2013/0187288 A1 | 7/2013 | Hong et al. |
| 2014/0097513 A1 | 4/2014 | Lee |
| 2014/0103516 A1 | 4/2014 | Yeom |
| 2014/0134804 A1 | 5/2014 | Kelly et al. |
| 2014/0138851 A1 | 5/2014 | Kim et al. |
| 2014/0217586 A1 | 8/2014 | Kim et al. |
| 2014/0367839 A1* | 12/2014 | Choi ................... H01L 23/481 257/686 |

\* cited by examiner

PACKAGE ON PACKAGES AND MOBILE COMPUTING DEVICES HAVING THE SAME

CROSS-REFERENCE TO RELATED APPLICATION(S)

This application claims priority from Korean Patent Application No. 10-2014-0173629, filed on Dec. 5, 2014, in the Korean Intellectual Property Office (KIPO), the entire contents of which are incorporated herein by reference.

BACKGROUND

1. Field

Some example embodiments of the inventive concepts may relate generally to package on packages. Some example embodiments of the inventive concepts may relate generally to package on packages that dispose stack connection balls used to stack bottom packages and top packages only around two sides facing each other among sides of a protective material including chip dies attached to a printed circuit board of the bottom packages. Some example embodiments of the inventive concepts may relate generally to mobile computing devices having the package on packages.

2. Description of Related Art

Packaging of a semiconductor chip may refer to intermediate step processes for connecting chip dies to external systems. As uses of portable devices such as smart phones and tablet personal computers (PCs) appears to be increasing, manufacturers may try to develop portable devices which are lighter and smaller. A considerably large number of integrated circuits may be used in the portable devices, and each of the integrated circuits may be packaged into semiconductor packages.

A package on package (PoP) saves may save space of system boards, and may be necessary for manufacture of smart phone and tablet PCs to reduce sizes of portable electronic devices. In particular, memory packages (e.g., top packages) may be stacked over logic packages (e.g., bottom packages) to reduce surface areas of printed circuit boards (PCBs). In order to reduce sizes of the portable electronic devices including a plurality of package on packages, sizes and heights of each of the plurality of package on packages may need to be decreased.

SUMMARY

Some example embodiments of the inventive concepts may provide package on packages.

Some example embodiments of the inventive concepts may provide package on packages that dispose stack connection balls used to stack bottom packages and top packages only around two sides facing each other among sides of a protective material including chip dies attached to a printed circuit board of the bottom packages.

Some example embodiments of the inventive concepts may provide mobile computing devices having the package on packages.

In some example embodiments, a package on package may comprise: a first printed circuit board (PCB); a bottom package which includes a first chip die and a second chip die attached to the first PCB; a top package which includes a second PCB and a third chip die attached to the second PCB, and is overlaid over the bottom package; and/or first stack connection solder balls and second stack connection solder balls which are electrically connected between the first PCB and the second PCB, and are formed only around two sides facing each other among sides of the bottom package.

In some example embodiments, the first chip die may comprise a modem chip die. The second chip die may comprise a dynamic random-access memory (DRAM) chip die or a pseudo static random-access memory (SRAM) chip die. The bottom package may comprise a system in package (SiP).

In some example embodiments, the first chip die may be attached to the first PCB in a flip-chip structure through first bumps. The second chip die is attached to the first PCB in the flip-chip structure through second bumps.

In some example embodiments, the first chip die may be attached to the first PCB in a flip-chip structure through first bumps. The second chip die may be attached to the first PCB in the flip-chip structure through second bumps. An empty space between the first chip die and the first PCB and an empty space between the second chip die and the first PCB may be filled with a capillary underfill (CUF) material.

In some example embodiments, the first chip die may be attached to the first PCB in a flip-chip structure through first bumps. The second chip die may be attached to the first PCB in the flip-chip structure through second bumps. An empty space between the first chip die and the first PCB, and an empty space between the second chip die and the first PCB, the first chip die, and the second chip die may be encapsulated using a molded underfill (MUF) material.

In some example embodiments, the first chip die may be attached to the first PCB in a flip-chip structure through bumps. The second chip die may be attached to the first PCB through wire bonding. An empty space between the first chip die and the first PCB, the first chip die, and the second chip die may be encapsulated using a molded underfill (MUF) material.

In some example embodiments, wherein the top package may further include a memory controller which is attached to the second PCB. The memory controller may be configured to control operation of the third chip die. The third chip die may comprise a flash-based memory chip die.

In some example embodiments, all signals and all supply voltages for operation of the third chip die and the memory controller may be transmitted only through the first stack connection solder balls.

In some example embodiments, each of the second stack connection solder balls may be in an electrically floating state.

In some example embodiments, all signals for operation of the third chip die and the memory controller, and a portion of first supply voltages for operation of at least one of the third chip die and the memory controller, may be transmitted through the first stack connection solder balls. A remaining portion of second supply voltages for operation of at least one of the third chip die and the memory controller may be transmitted through the second stack connection solder balls.

In some example embodiments, the second supply voltages input through respective solder balls attached to a bottom surface of the first PCB may be transmitted to the bottom package and the second stack connection solder balls through the first PCB.

In some example embodiments, the first chip die and the second chip die may transmit or may receive signals to or from each other only through signal lines formed in the first PCB.

In some example embodiments, a mobile computing device may comprise: a system board; a first package attached to the system board; and/or a power management integrated circuit (PMIC) attached to the system board and configured to supply first supply voltages to the first package through the system board. The first package may include: a first printed circuit board (PCB); a bottom package which includes a first chip die and a second chip die attached to the first PCB; a top package which includes a second PCB and a third chip die attached to the second PCB, and is overlaid over the bottom package; and/or first stack connection solder balls and second stack connection solder balls which are electrically connected between the first PCB and the second PCB, and are formed only around two sides facing each other among sides of the bottom package.

In some example embodiments, the first chip die may comprise a modem chip die. The second chip die may comprise a dynamic random-access memory (DRAM) chip die or a pseudo static random-access memory (SRAM) chip die. The bottom package may comprise a system in package (SiP).

In some example embodiments, the top package may further include a memory controller attached to the second PCB. The memory controller may be configured to control operation of the third chip die. The third chip die may comprise a flash-based memory chip die.

In some example embodiments, all signals for operation of the third chip die and the memory controller, and all of the first supply voltages for operation of the third chip die and the memory controller, may be transmitted only through the first stack connection solder balls.

In some example embodiments, the mobile computing device may further include a second package attached to the system board and includes an application processor chip die. The PMIC may be configured to supply second supply voltages to the application processor chip die through the system board. The system board may include signal lines configured to transmit signals transmitted or received between the application processor chip die and the first package. The signal lines may be connected to corresponding stack connection solder balls among the first stack connection solder balls through the first PCB.

In some example embodiments, the system board may include a ground line. The first supply voltages may include operation voltages and a ground voltage. A connection solder ball related to the ground voltage from among the first stack connection solder balls may be connected to the ground line through the first PCB. The operation voltages may be supplied to corresponding stack connection solder balls among the first stack connection solder balls through the first PCB.

In some example embodiments, all signals for operation of the third chip die and the memory controller, and second supply voltages for operation of at least one of the third chip die and the memory controller from among the first supply voltages, may be transmitted only through the first stack connection solder balls. Third supply voltages for operation of the at least one of the third chip die and the memory controller from among the first supply voltages may be transmitted only through respective connection solder balls from among the second stack connection solder balls. The third supply voltages input through solder balls attached to a bottom surface of the first PCB may be transmitted to the respective connection solder balls and the bottom package through the first PCB.

In some example embodiments, the mobile computing device may further include a second package attached to the system board and includes an application processor chip die. The PMIC may be configured to supply fourth supply voltages to the application processor chip die through the system board. The system board may include signal lines which transmit signals transmitted or received between the application processor chip die and the first package. The signal lines may be connected to corresponding stack connection solder balls among the first stack connection solder balls through the first PCB.

In some example embodiments, an electronic device may comprise: a first printed circuit board (PCB); a first chip die on the first PCB; a second chip die on the first PCB; a second PCB on the first and second chip dies; at least one third chip die on the second PCB; and/or first stack connection solder balls and second stack connection solder balls electrically connected between the first PCB and the second PCB. The first stack connection solder balls may be on an opposite side of the first and second chip dies from the second stack connection solder balls.

In some example embodiments, the second chip die may be on the first chip die.

In some example embodiments, the first chip die may comprise a modem chip die. The second chip die may comprise a dynamic random-access memory (DRAM) chip die or a pseudo static random-access memory (SRAM) chip die.

In some example embodiments, the first chip die may be attached to the first PCB in a flip-chip structure through first bumps. The second chip die may be attached to the first PCB in the flip-chip structure through second bumps.

In some example embodiments, the first chip die may be attached to the first PCB in a flip-chip structure through first bumps. The second chip die may be attached to the first PCB in the flip-chip structure through second bumps. An empty space between the first chip die and the first PCB and an empty space between the second chip die and the first PCB may be filled with a capillary underfill (CUF) material.

In some example embodiments, the first chip die may be attached to the first PCB in a flip-chip structure through first bumps. The second chip die may be attached to the first PCB in the flip-chip structure through second bumps. An empty space between the first chip die and the first PCB, and an empty space between the second chip die and the first PCB, the first chip die, and the second chip die may be encapsulated using a molded underfill (MUF) material.

In some example embodiments, the first chip die may be attached to the first PCB in a flip-chip structure through bumps. The second chip die may be attached to the first PCB through wire bonding. An empty space between the first chip die and the first PCB, the first chip die, and the second chip die may be encapsulated using a molded underfill (MUF) material.

In some example embodiments, the electronic device may further comprise: a memory controller on the second PCB. The memory controller may be configured to control operation of the at least one third chip die.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION OF THE EMBODIMENTS

Figure 1:
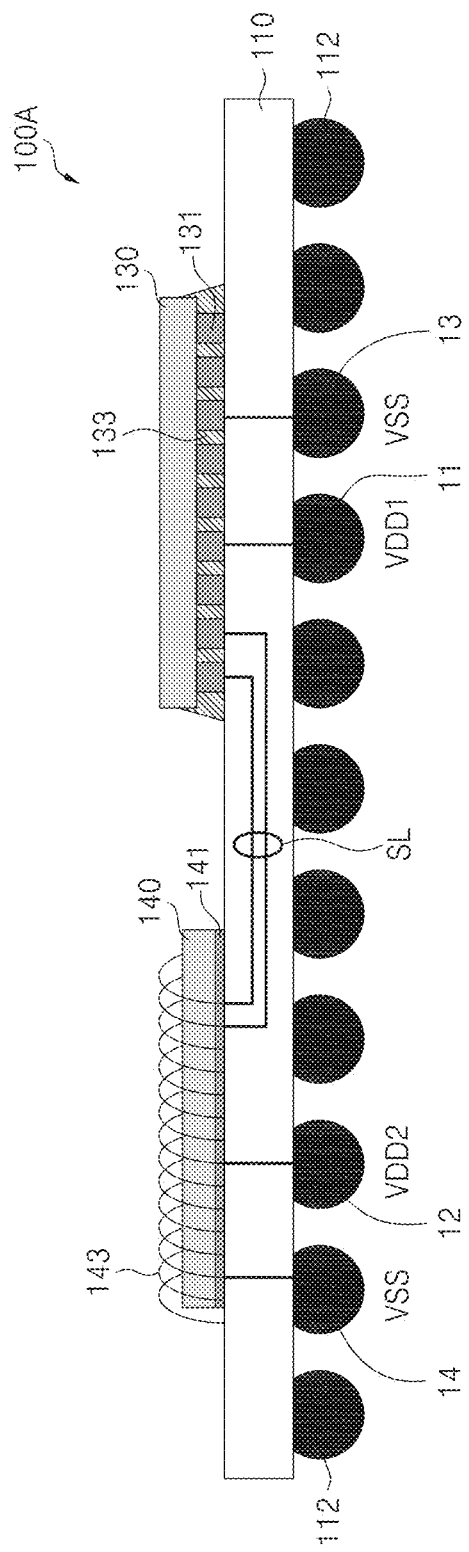
FIGS. 1 to 14 are cross-sectional views of bottom packages according to some example embodiments of the inventive concepts.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIGS. 1 to 14 are cross-sectional views of bottom packages according to some example embodiments of the inventive concepts.

Referring to FIG. 1, a bottom package 100A may include a first printed circuit board (PCB) 110, a first chip die 130, and a second chip die 140 each attached or mounted on a top surface of the first PCB 110. Solder balls 112 may be attached to a bottom surface of the first PCB 110. Solder balls 131 may be attached to a top surface of the first PCB 110. The solder balls 112 or 131 may be bumps, solder bumps, or copper bumps. The solder balls 112 include solder balls 11 to 14.

The solder balls, the bumps, the solder bumps, or the copper bumps described in the present specification are some example embodiments of interconnections. The solder ball 112 may be attached to a bottom surface of the first PCB 110 through a pad. A pad having conductivity may be a pin or a land pad.

A chip die may be a chip or a die. According to some example embodiments, bottom packages 100A to 100J, 100A-1, 100B-1, 100C-1, and 100D-1 shown in FIGS. 1 to 14 may be embodied in a system in package (SiP); however, example embodiments are not limited thereto.

A first chip die 130 may be attached to the first PCB 110 in a flip-chip structure. According to some example embodiments, the first chip die 130 may be attached to the first PCB 110 through the solder balls 131. According to some example embodiments, the first chip die 130 may be embodied in a modem chip die or a modem chip die which supports a Wideband Code Division Multiple Access (WCDMA) communication method; however, example embodiments are not limited thereto.

As the first chip die 130 is attached to the first PCB 110 through the solder balls 131, an empty space between a top of the first PCB 110 and the first chip die 130 may be filled with a underfill material 133. For example, the underfill material 133 may fill the space through a capillary underfill (CUF) process. Accordingly, the underfill material filling the empty space through the CUF process is referred to as a CUF material.

The second chip die 140 may be attached to the first PCB 110 through a die attach material 141. According to some example embodiments, the die attach material 141 may be a film or a liquid epoxy adhesive; however, example embodiments are not limited thereto. According to some example embodiments, the second chip die 140 may be embodied in a dynamic random access memory (DRAM) chip die or a pseudo static random access memory (SRAM) chip die; however, example embodiments are not limited thereto. The pseudo SRAM may include a DRAM micro core having a SRAM interface.

The second chip die 140 may be in contact with the first PCB 110 using wire bonding. Moreover, the second chip die 140 may transmit or receive signals to or from the first PCB 110 using wires 143. The first chip die 130 and the second chip die 140 may be attached to the first PCB 110 side by side.

FIG. 1 shows an example embodiment in which the first chip die 130 is attached to the first PCB 110 in a flip-chip structure, and the second chip die 140 is attached to the first PCB 110 through the die attach material 141; however, example embodiments are not limited thereto. The first chip die 130 and the second chip die 140 may be electrically connected to each other through signal lines SL embodied in the first PCB 110. Accordingly, the first chip die 130 and the second chip die 140 may transmit or receive signals to or from each other through the signal lines SL.

Supply voltages may include an operation voltage and a ground voltage. The supply voltages may provide power. A first operation voltage VDD1 may be supplied to the first chip die 130 through a solder ball 11 and the first PCB 110, and a ground voltage VSS may be supplied to the first chip die 130 through a solder ball 13 and the first PCB 110. A second operation voltage VDD2 may be supplied to the second chip die 140 through a solder ball 12 and the first PCB 110, and the ground voltage VSS may be supplied to the second chip die 140 through a solder ball 14 and the first PCB 110.

That is, contacts or pins related to the first operation voltage VDD1 and the ground voltage VSS (e.g., supply voltages) of the first chip die 130 may be pinned-out through the solder balls 11 and 13, and contacts or pins related to the second operation voltage VDD2 and the ground voltage VSS (e.g., supply voltages) of the second chip die 140 may be pinned-out through the solder balls 12 and 14.

Figure 2:
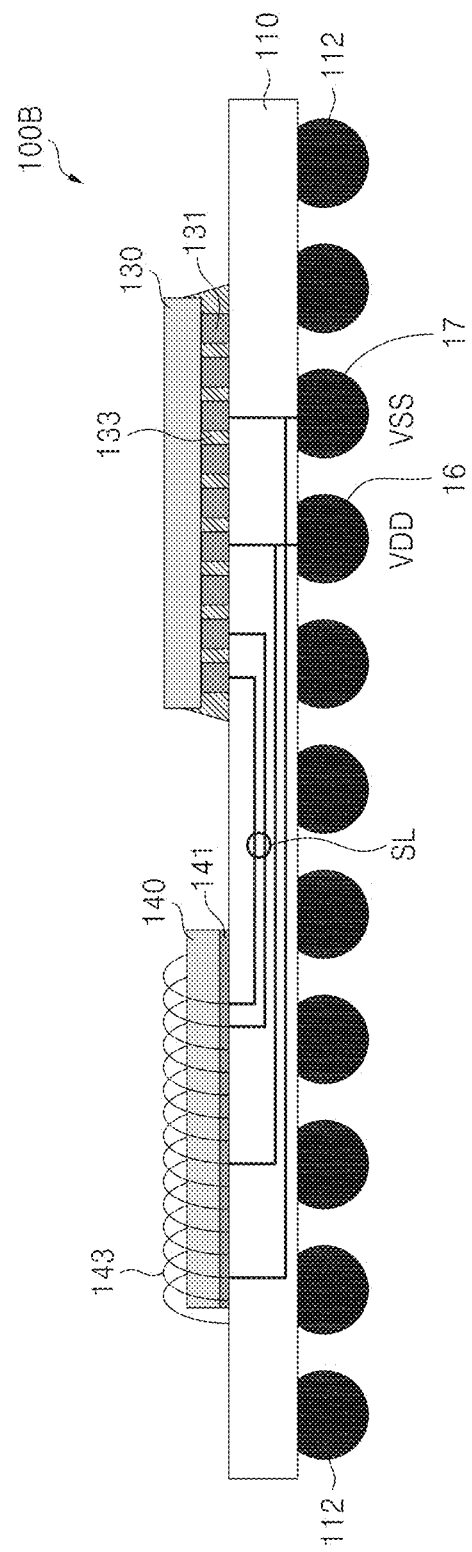

Referring to FIG. 2, a bottom package 100B includes the first chip die 130 and the second chip die 140 attached to the first PCB 110. Referring to FIGS. 1 and 2, the first chip die 130 and the second chip die 140 attached to the first PCB 110 may be provided with an operation voltage VDD through a solder ball 16 and the first PCB 110, and may be provided with the ground voltage VSS through a solder ball 17 and the first PCB 110. That is, contacts or pins related to the operation voltage VDD and the ground voltage VSS (e.g., supply voltages) of each of the first chip die 130 and the second chip die 140 may be pinned-out through solder balls 16 and 17.

Figure 3:
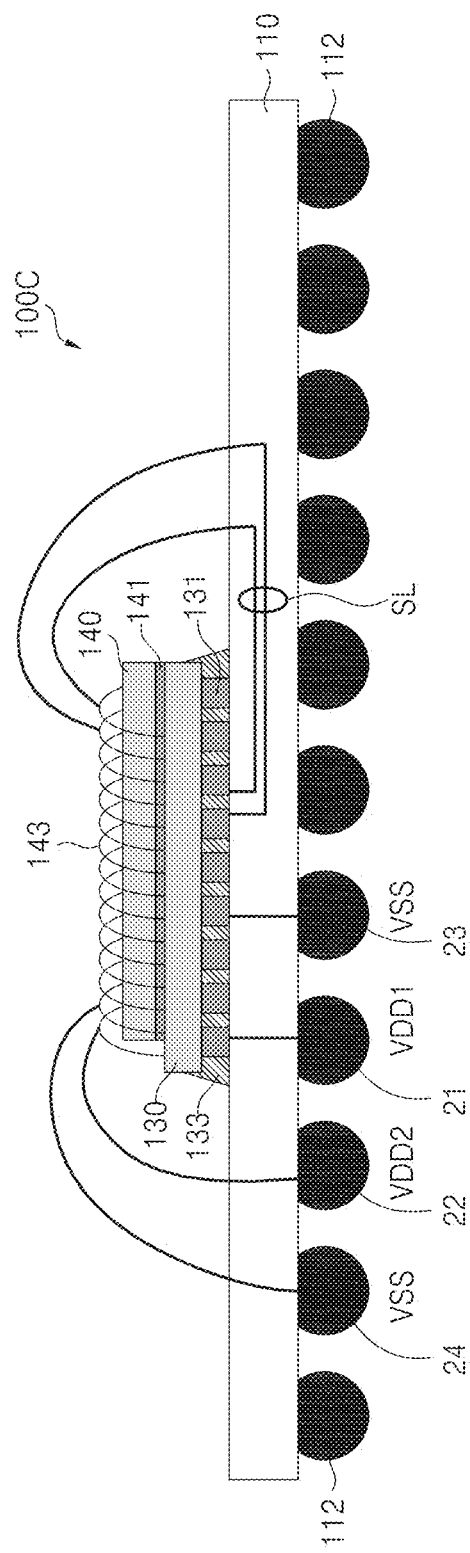

Referring to FIG. 3, a bottom package 100C may include the second chip die 140 stacked on or over the first chip die 130. The second chip die 140 may be stacked over a top surface of the first chip die 130 through the die attach material 141. The second chip die 140 may be connected to the first PCB 110 through wires and pads. That is, the second chip die 140 may be connected to the first PCB 110 through wire bonding.

The first chip die 130 and the second chip die 140 may be connected to each other through signal lines SL embodied in the first PCB 110. Accordingly, the first chip die 130 and the second chip die 140 may transmit or receive signals to or from each other through the signal lines SL embodied in the first PCB 110.

The first operation voltage VDD1 may be supplied to the first chip die 130 through a solder ball 21, and the ground voltage VSS may be supplied to the first chip die 130 through a solder ball 23. The second operation voltage VDD2 may be supplied to the second chip die 140 through a solder ball 22, and the ground voltage VSS may be supplied to the second chip die 140 through a solder ball 24.

Figure 4:
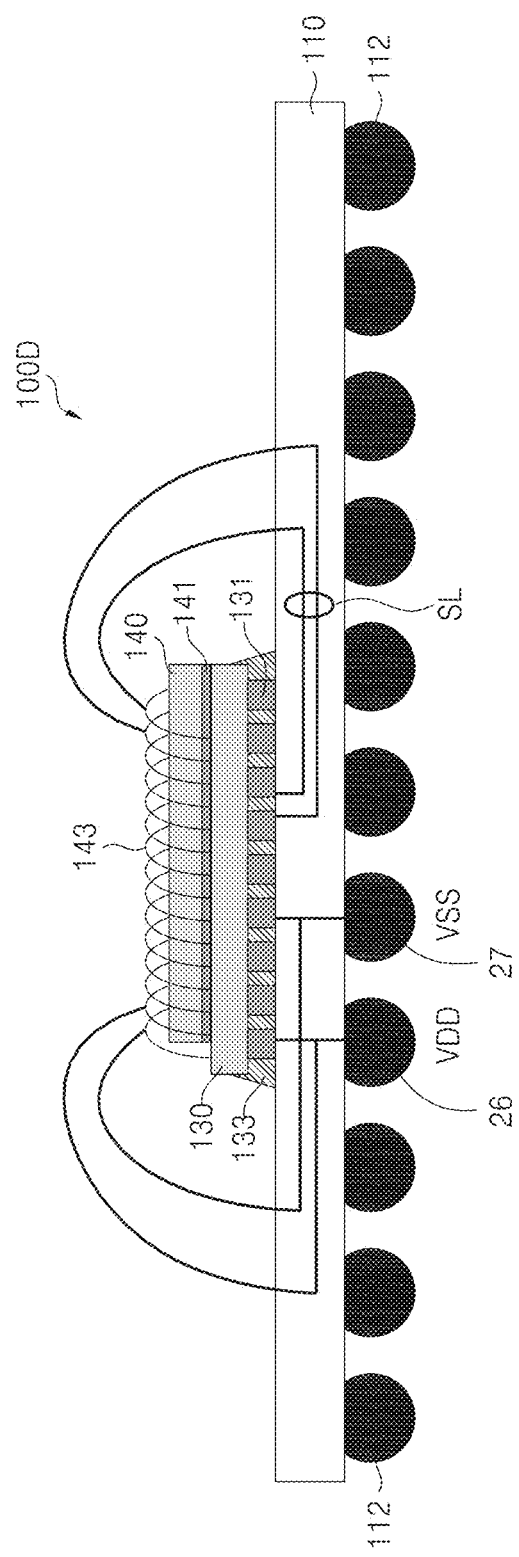

Referring to FIGS. 3 and 4, a bottom package 100D includes the second chip die 140 stacked on or over the first chip die 130. The first chip die 130 and the second chip die 140 attached to the first PCB 110 are provided with the operation voltage VDD through a solder ball 26, and are provided with the ground voltage VSS through a solder ball 27.

Figure 5:
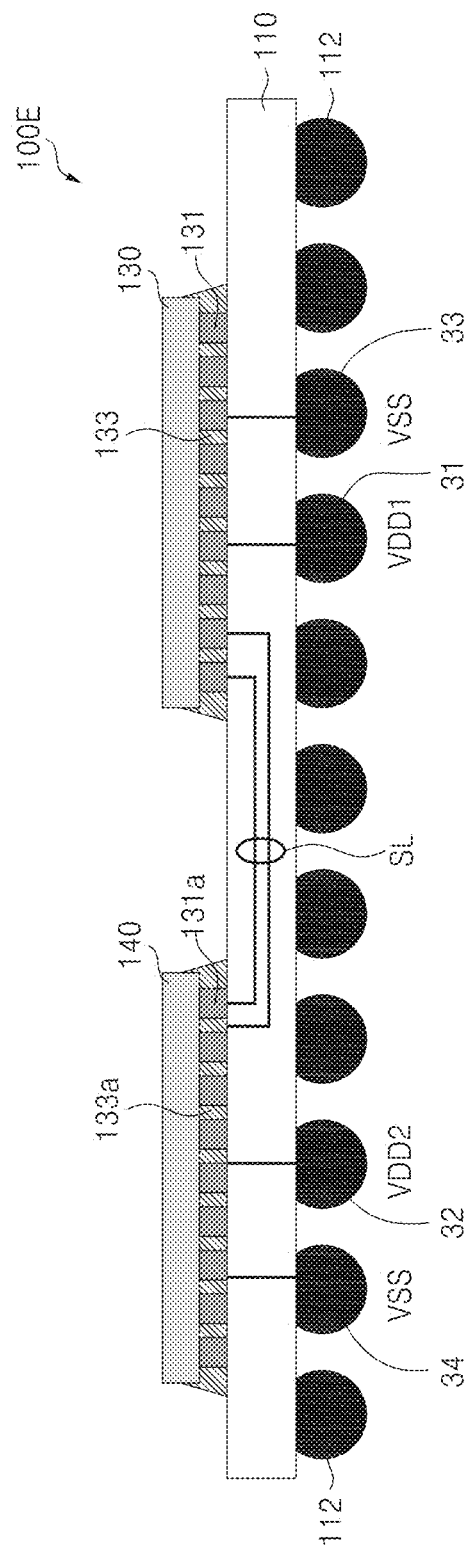

Referring to FIG. 5, a bottom package 100E includes the first chip die 130 and the second chip die 140 attached to the first PCB 110. Each of the first chip die 130 and the second chip die 140 may be attached to the first PCB 110 in a flip-chip structure.

The second chip die 140 may be attached to the first PCB 110 through solder balls 131a. An empty space between a top of the first PCB 110 and the second chip die 140 may be filled with an underfill material 133a. The underfill material 133a may be the CUF material. The first chip die 130 and the second chip die 140 may transmit or receive signals to or from each other through the signal lines SL embodied in the first PCB 110.

The first operation voltage VDD1 is supplied to the first chip die 130 through a solder ball 31, and the ground voltage VSS is supplied to the first chip die 130 through a solder ball 33. The second operation voltage VDD2 is supplied to the second chip die 140 through a solder ball 32 and the ground voltage VSS is supplied to the second chip die 140 through a solder ball 34.

Figure 6:
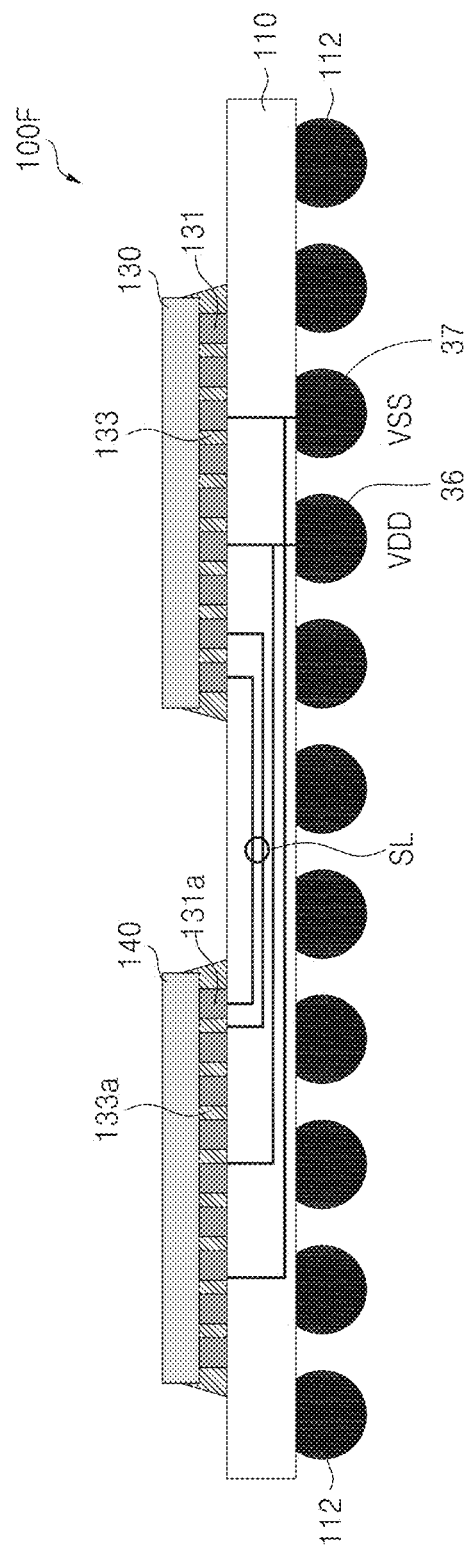

Referring to FIG. 6, a bottom package 100F includes the first chip die 130 and the second chip die 140 attached to the first PCB 110. The first chip die 130 and the second chip die 140 attached to the first PCB 110 are provided with the operation voltage VDD through a solder ball 36 and are provided with the ground voltage VSS through a solder ball 37.

Figure 7:
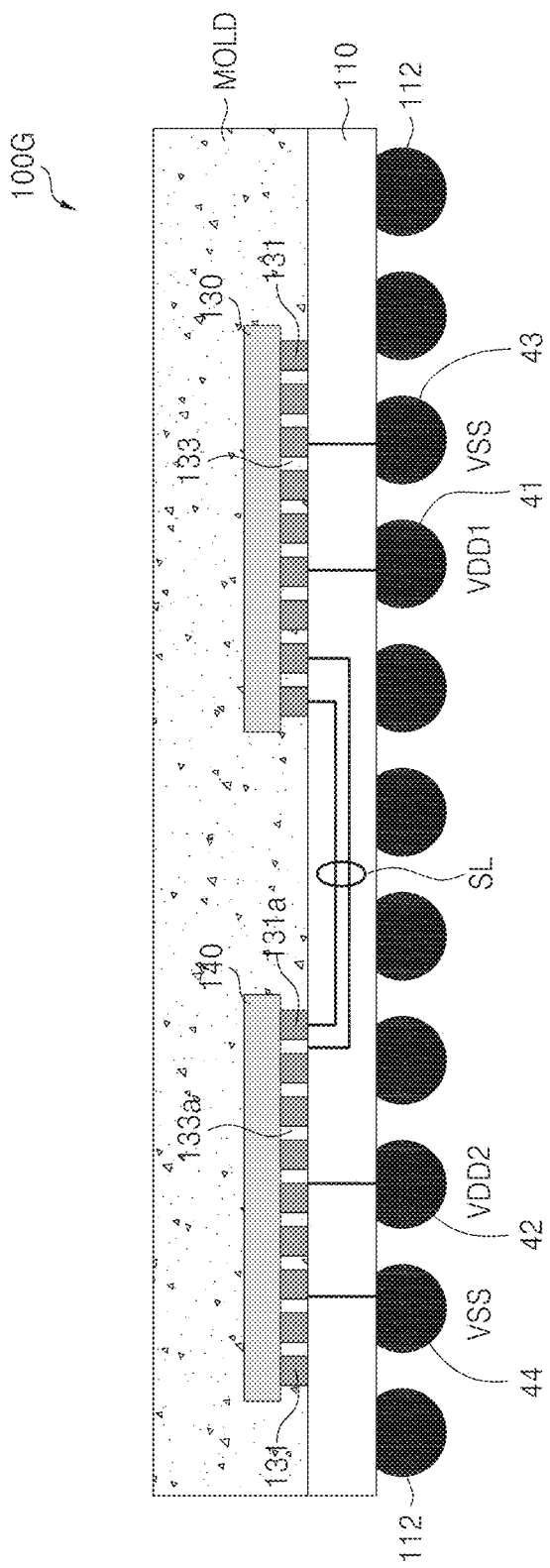

Referring to FIG. 7, a bottom package 100G includes the first chip die 130 and the second chip die 140 attached to the first PCB 110. Each of the first chip die 130 and the second chip die 140 is attached to the first PCB 110 in a flip-chip structure.

The first chip die 130 and the second chip die 140 may be molded using a MUF material MOLD through a molded underfill (MUF) process. At this time, an empty space between each of the first chip die 130 and the second chip die 140 and the first PCB 110 may be filled with the MUF material MOLD. For example, the MUF material MOLD may be an epoxy molding compound (EMC); however, example embodiments are not limited thereto.

The first operation voltage VDD1 is supplied to the first chip die 130 through a solder ball 41, and the ground voltage VSS is supplied to the first chip die 130 through a solder ball 43. The second operation voltage VDD2 is supplied to the second chip die 140 through a solder ball 42, and the ground voltage VSS is supplied to the second chip die 140 through a solder ball 44.

Figure 8:
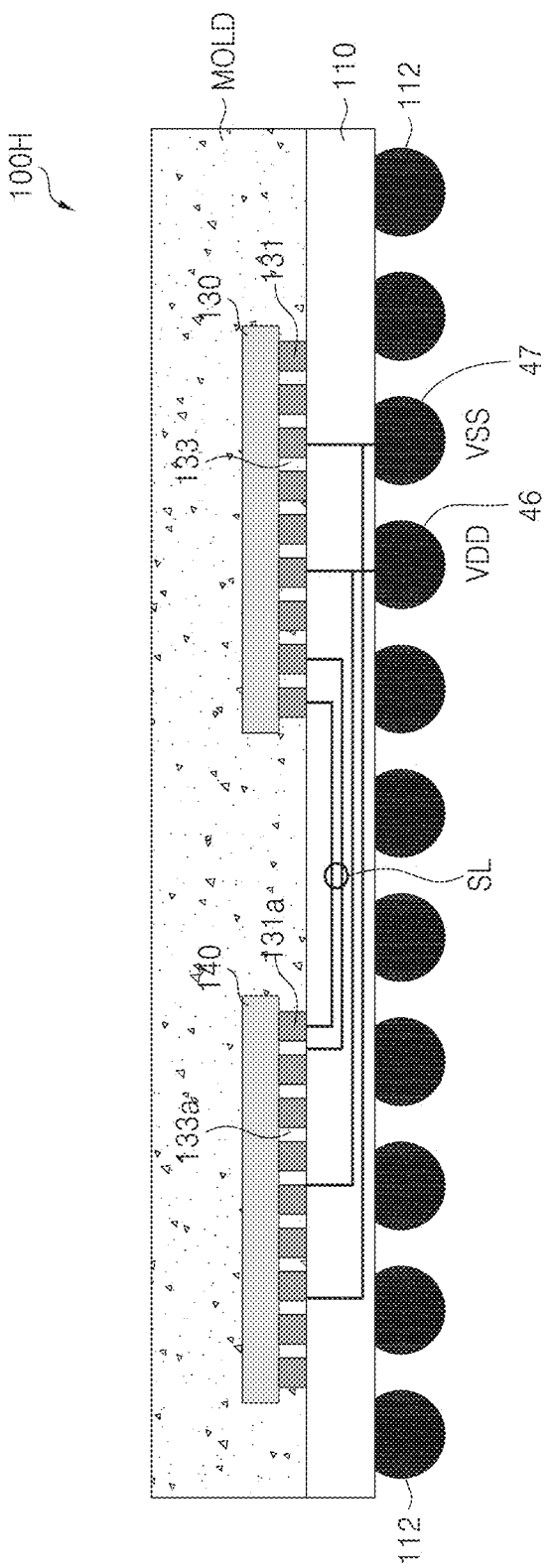

Referring to FIG. 8, a bottom package 100H includes the first chip die 130 and the second chip die 140 attached to the first PCB 110. Each of the first chip die 130 and the second chip die 140 is attached to the first PCB 110 in a flip-chip structure.

The first chip die 130 and the second chip die 140 may be molded using the MUF material MOLD. At this time, an empty space between each of the first chip die 130 and the second chip die 140 and the first PCB 110 may be filled with the MUF material MOLD. The first chip die 130 and the second chip die 140 attached to the first PCB 110 are provided with the operation voltage VDD through a solder ball 46, and are provided with the ground voltage VSS through a solder ball 47.

Figure 9:
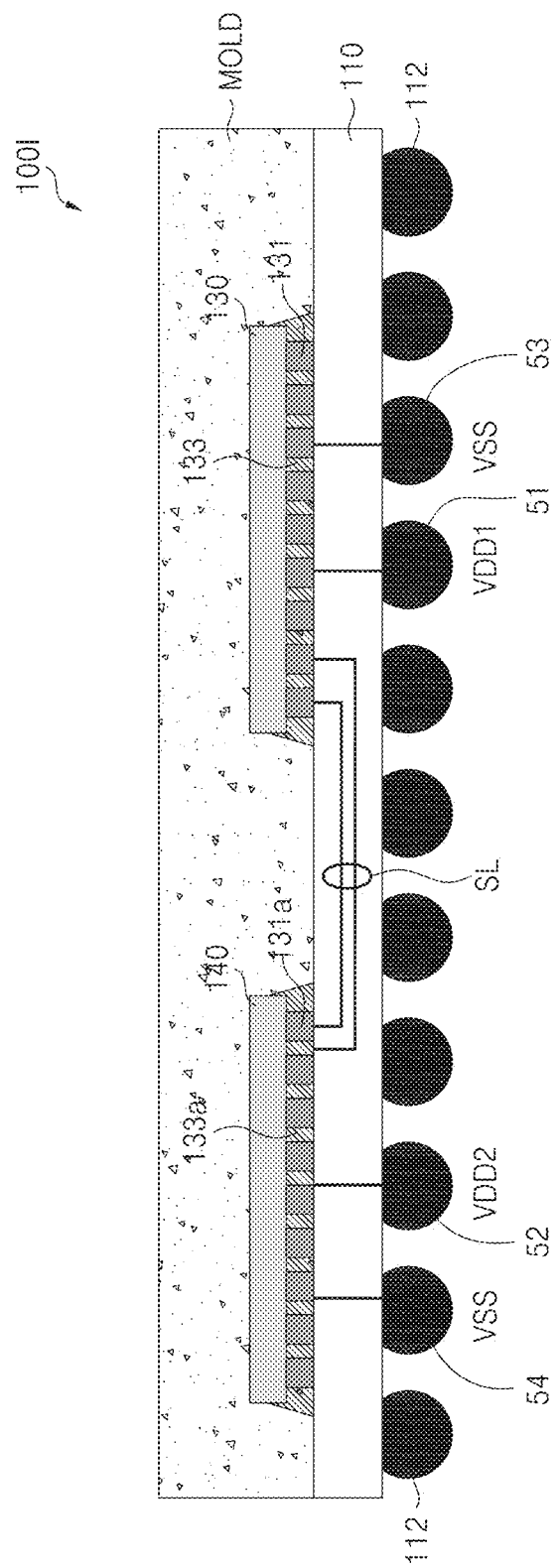

Referring to FIG. 9, a bottom package 100I includes the first chip die 130 and the second chip die 140 attached to the first PCB 110. Each of the first chip die 130 and the second chip die 140 is attached to the first PCB 110 in a flip-chip structure.

An empty space between the first chip die 130 and the first PCB 110 may be filled with a underfill material 133 through the CUF process, and an empty space between the second chip die 140 and the first PCB 110 may be filled with a underfill material 133a through the CUF process. A periphery of the first chip die 130 and a periphery of the second chip die 140 may be encapsulated using the MUF material MOLD through the MUF process.

The first operation voltage VDD1 may be supplied to the first chip die 130 through a solder ball 51, and the ground voltage VSS may be supplied to the first chip die 130 through a solder ball 53. The second operation voltage VDD2 may be supplied to the second chip die 140 through a solder ball 52, and the ground voltage VSS may be supplied to the second chip die 140 through a solder ball 54.

Figure 10:
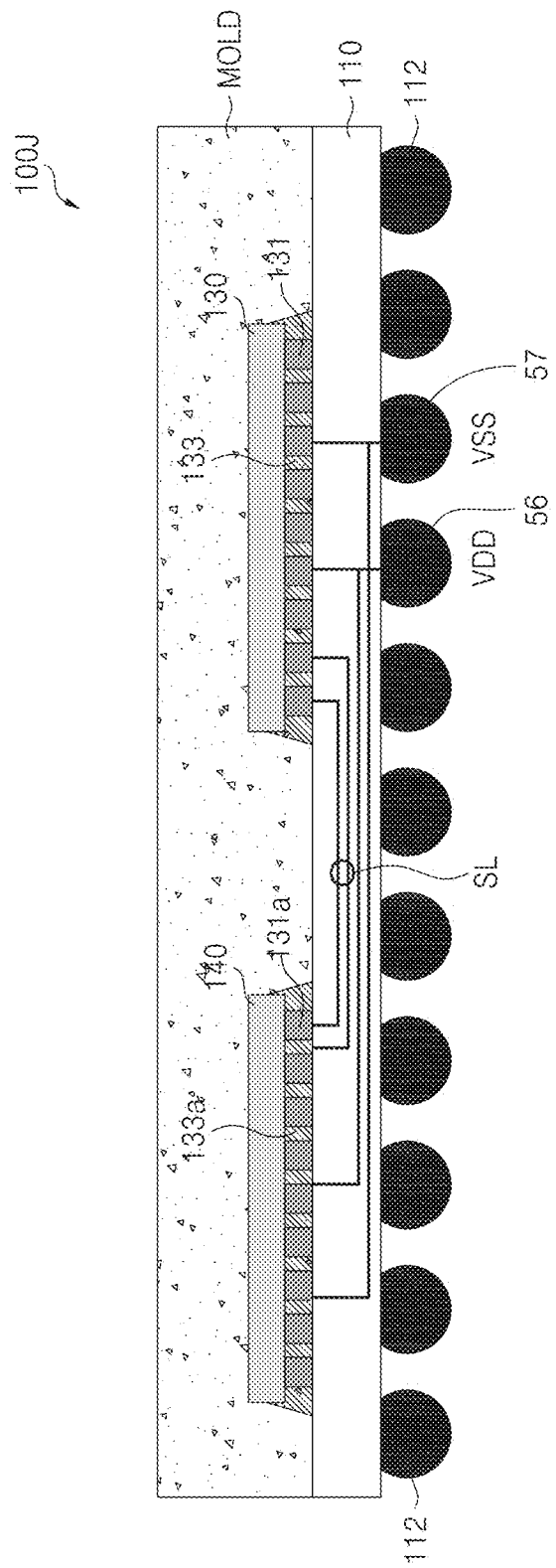

Referring to FIG. 10, a bottom package 100J includes the first chip die 130 and the second chip die 140 attached to the first PCB 110. Each of the first chip die 130 and the second chip die 140 is attached to the first PCB 110 in a flip-chip structure.

The first chip die 130 and the second chip die 140 may be encapsulated through the CUF process and the MUF process. The first chip die 130 and the second chip die 140 attached to the first PCB 110 are provided with the operation voltage VDD through a solder ball 56, and are provided with the ground voltage VSS through a solder ball 57.

Figure 11:
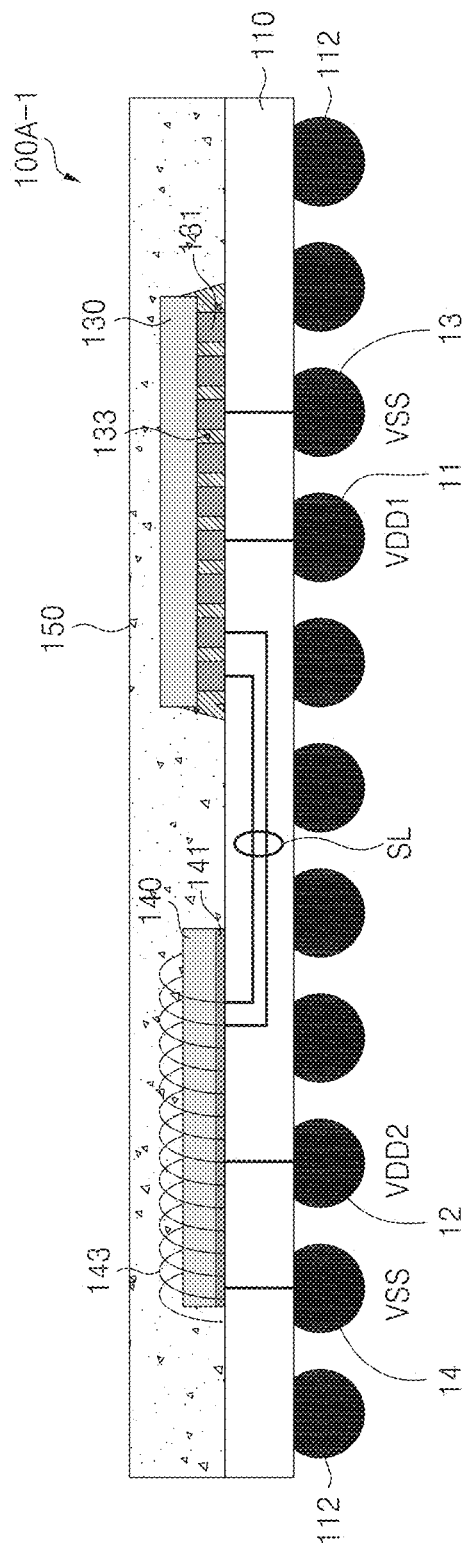

Referring to FIGS. 1 and 11, a bottom package 100A-1 includes the first chip die 130 attached to the first PCB 110 in a flip-chip structure and the second chip die 140 connected to the first PCB 110 through wire bonding.

The first chip die 130 and the second chip die 140 may be surrounded by a protective material 150 formed through the MUF process. For example, the protective material 150 may be an epoxy molding compound (EMC); however, example embodiments are not limited thereto.

Figure 12:
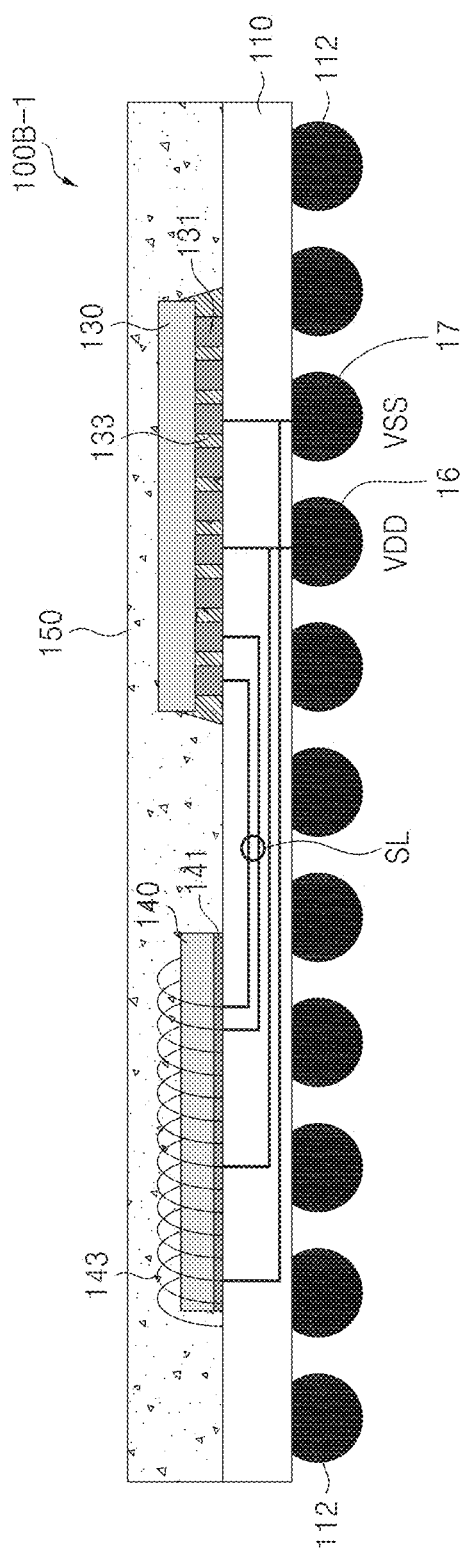

Referring to FIGS. 2 and 12, a bottom package 100B-1 includes the first chip die 130 attached to the first PCB 110 in a flip-chip structure and the second chip die 140 connected to the first PCB 110 through wire bonding. The first chip die 130 and the second chip die 140 may be surrounded by the protective material 150 formed through the MUF process. For example, the protective material 150 may be an EMC; however, example embodiments are not limited thereto.

Figure 13:
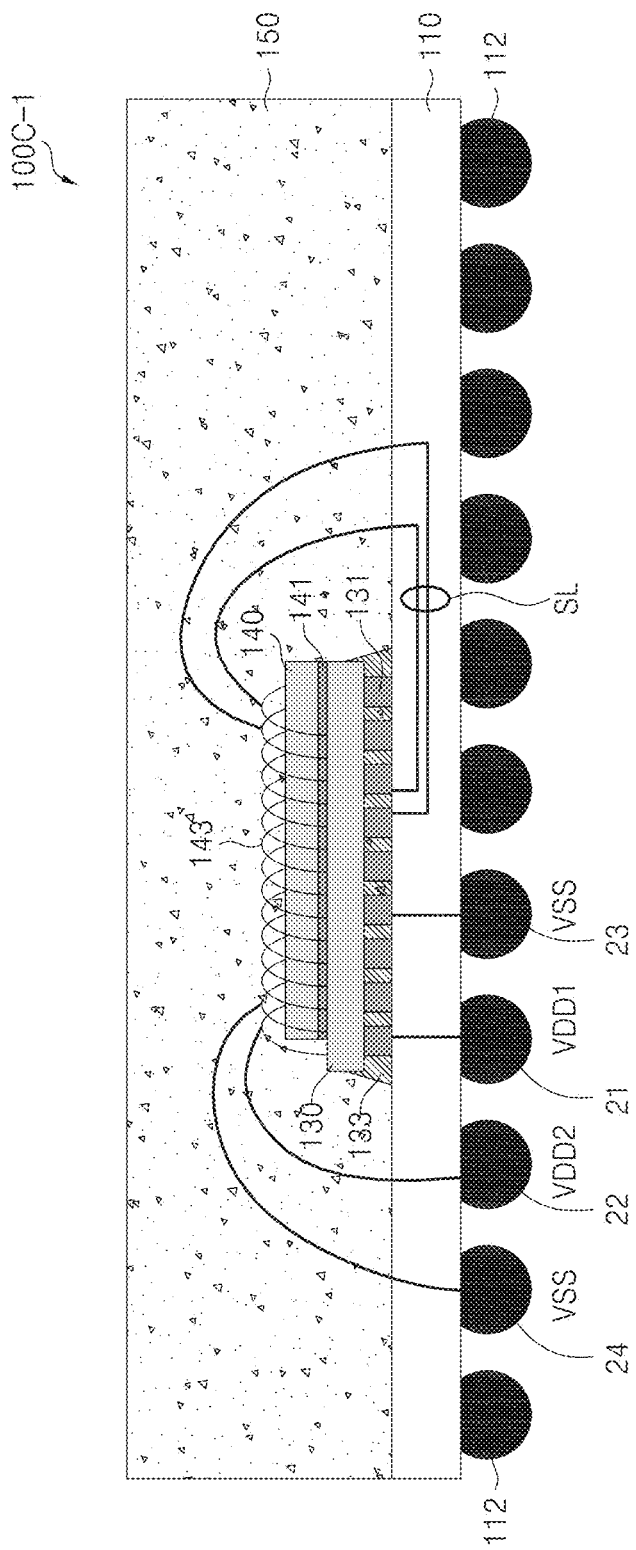

Referring to FIGS. 3 and 13, a bottom package 100C-1 includes the second chip die 140 stacked on or over the first chip die 130. The first chip die 130 and the second chip die 140 may be surrounded by the protective material 150 formed through the MUF process. For example, the protective material 150 may be an EMC; however, example embodiments are not limited thereto.

Figure 14:
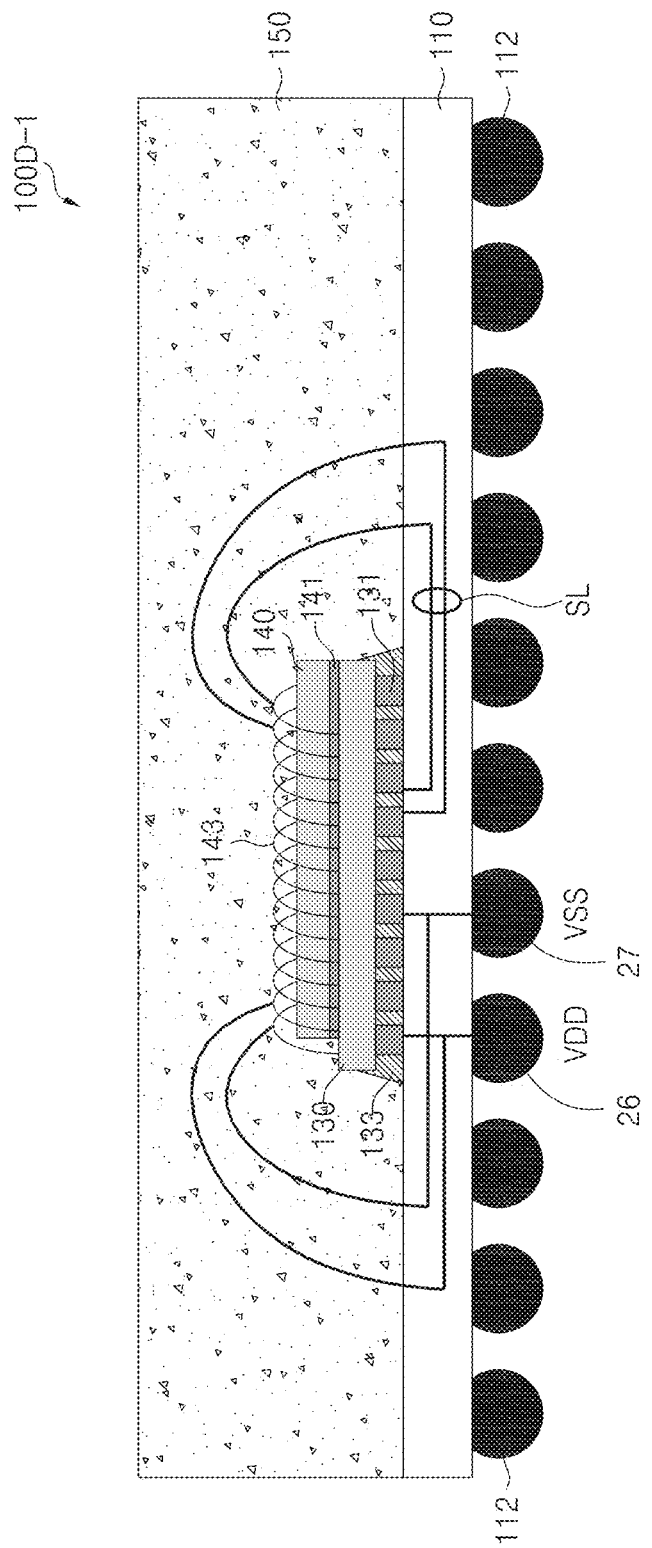

Referring to FIGS. 4 and 14, a bottom package 100D-1 includes the second chip die 140 stacked on or over the first chip die 130. The first chip die 130 and the second chip die 140 may be surrounded by the protective material 150 formed through the MUF process. For example, the protective material 150 may be an EMC; however, example embodiments are not limited thereto.

Figure 15:
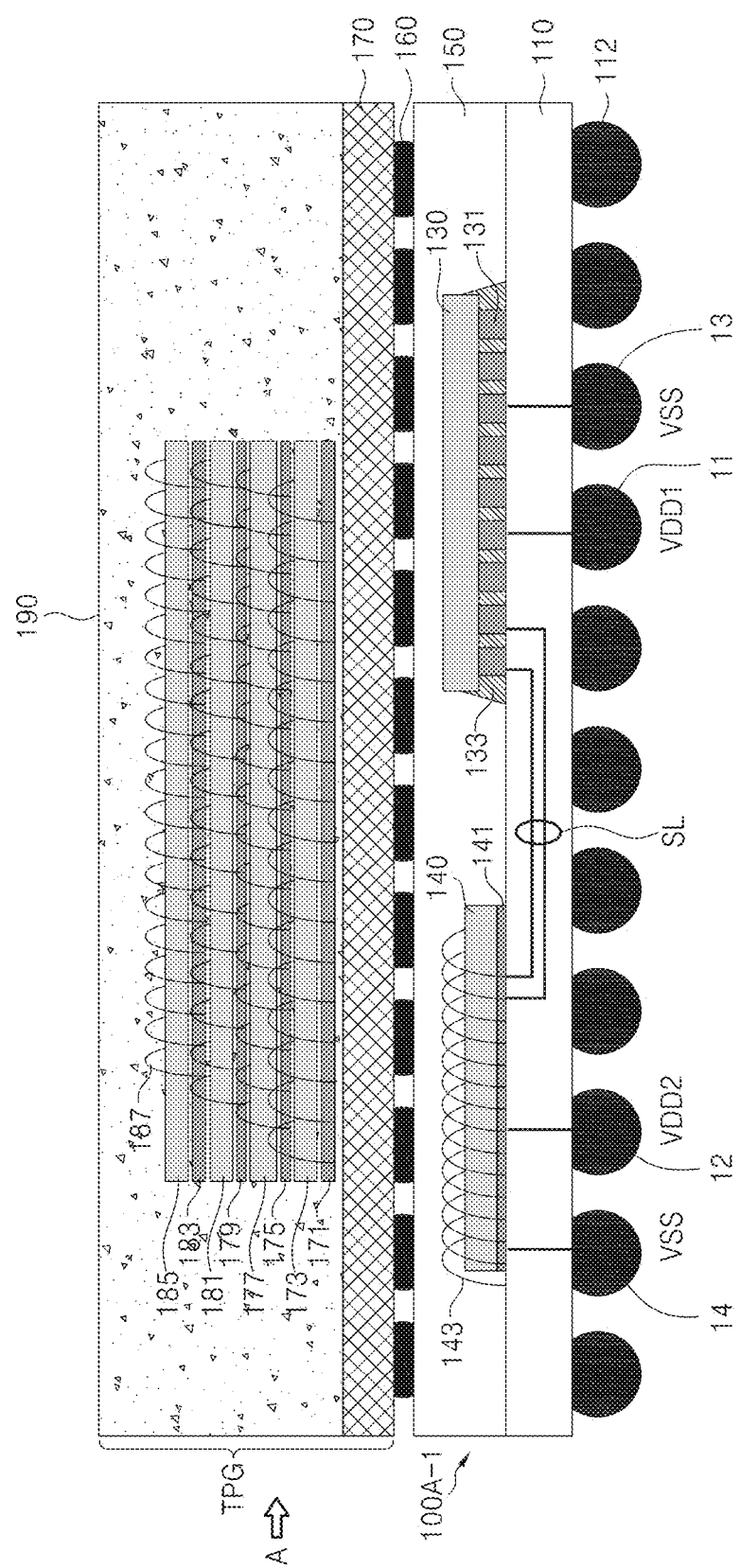
FIGS. 15 to 18 are cross-sectional views of package on packages including a bottom package and a top package according to some example embodiments of the inventive concepts.
Figure 16:
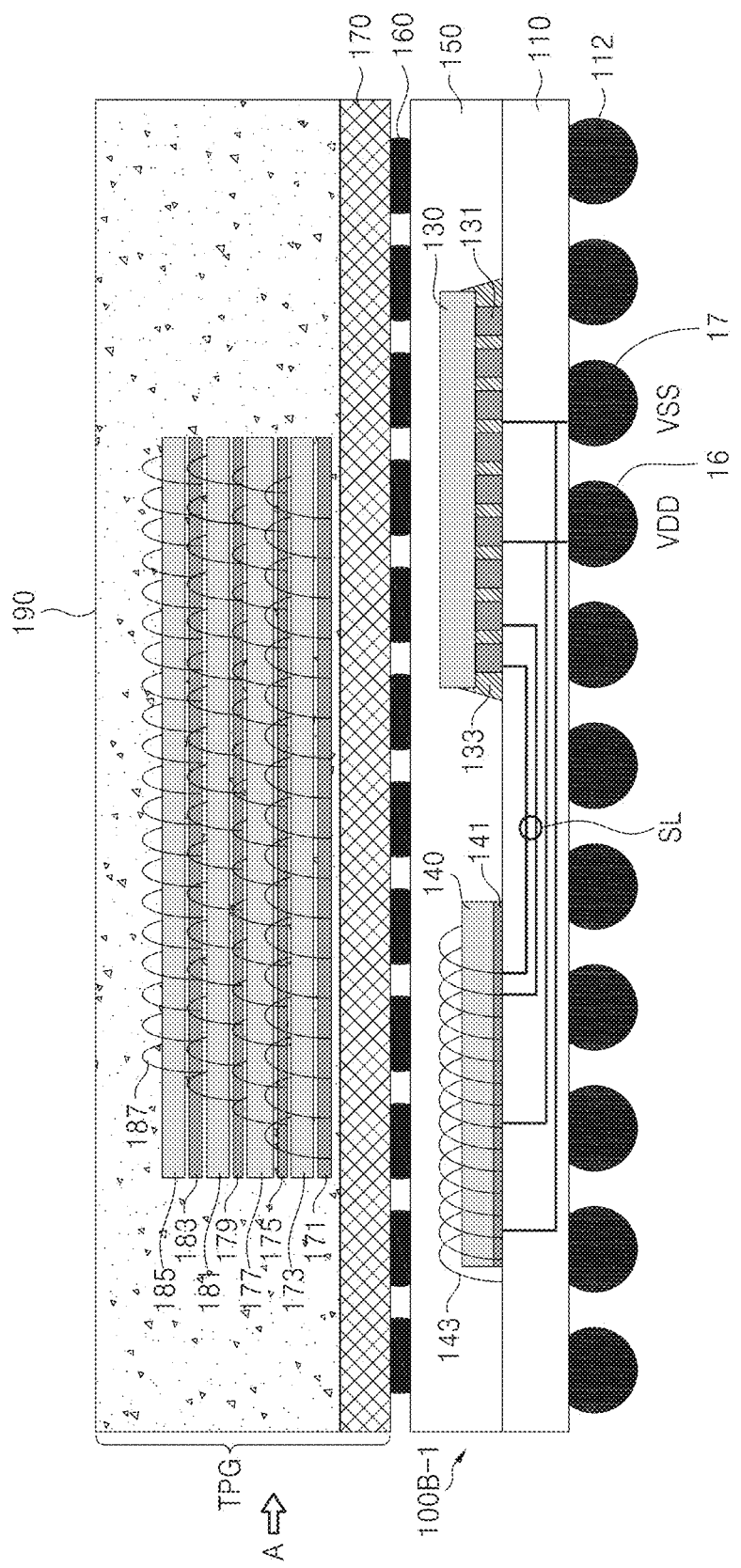
Figure 17:
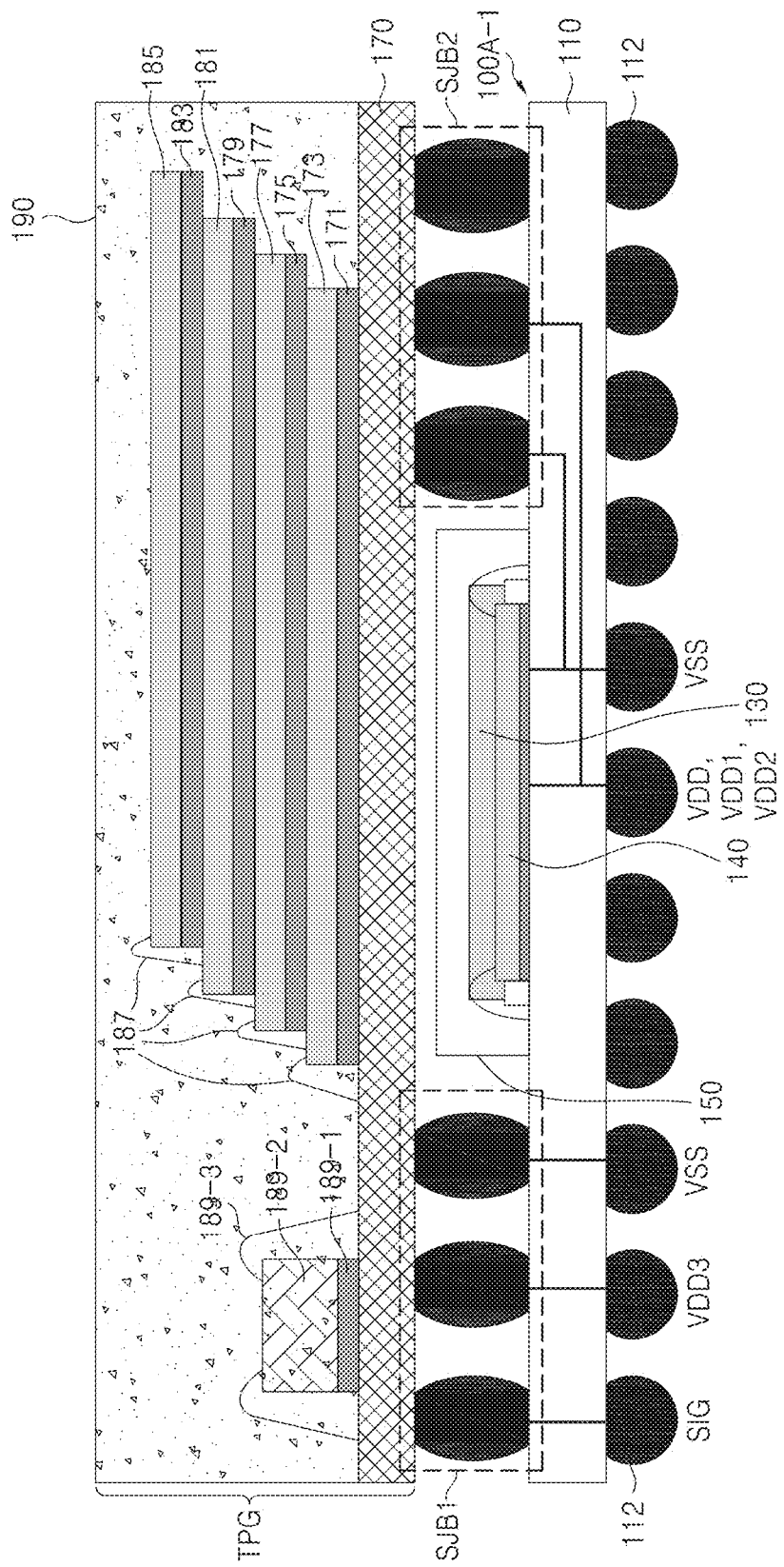

FIGS. 15 to 18 are cross-sectional views of package on packages including a bottom package and a top package according to some example embodiments of the inventive concepts. Referring to FIGS. 11 and 15, a second PCB 170 of a top package TPG may be electrically connected to the first PCB 110 through interconnections 160 (e.g., stack connection solder balls 160). As shown in FIG. 17, the stack connection solder balls 160 may include first stack connection solder balls SJB1 and second stack connection solder balls SJB2. As described above, a stack connection solder ball may be connected between a pad formed on a top surface of the first PCB 110 and a pad formed on a bottom surface of the second PCB 170. The top package TPG may be stacked over the bottom package 100A-1.

The top package TPG may include at least one third chip die attached to the second PCB 170. For convenience of description in FIGS. 15 to 18, four third chip dies 173, 177, 181, and 185 and four die attach materials 171, 175, 179, and 183 are shown; however, example embodiments are not limited thereto. Accordingly, the number of third chip dies and the number of die attach materials included in the top package TPG may be variously changed according to some example embodiments.

Each of the four third chip dies 173, 177, 181, and 185 may be a flash-based memory chip die (e.g., a logical NOT AND (NAND) flash chip die or a logical NOT OR (NOR) flash chip die); however, example embodiments are not limited thereto. Each of the four third chip dies 173, 177, 181, and 185 may be connected to each other through wires 187. Moreover, each of the four third chip dies 173, 177, 181, and 185 may transmit or receive signals to or from the second PCB 170 through the wires 187.

Each of the die attach materials 171, 175, 179, and 183 may be a film or a liquid epoxy adhesive; however, example embodiments are not limited thereto.

The top package TPG may further include a memory controller 189-2 attached to the second PCB 170 using a die attach material 189-1. When each of the four third chip dies 173, 177, 181, and 185 is a NAND flash chip die, the memory controller 189-2 may be a NAND flash controller. The memory controller 189-2 may transmit or receive signals to or from the second PCB 170 through wires 189-3.

The four third chip dies 173, 177, 181, and 185, the memory controller 189-2, and the wires 187 and 189-3 may be molded using a protective material 190. The protective material 190 may be formed through the MUF process; however, example embodiments are not limited thereto. For example, the protective material 190 may be an EMC; however, example embodiments are not limited thereto.

Figure 19:
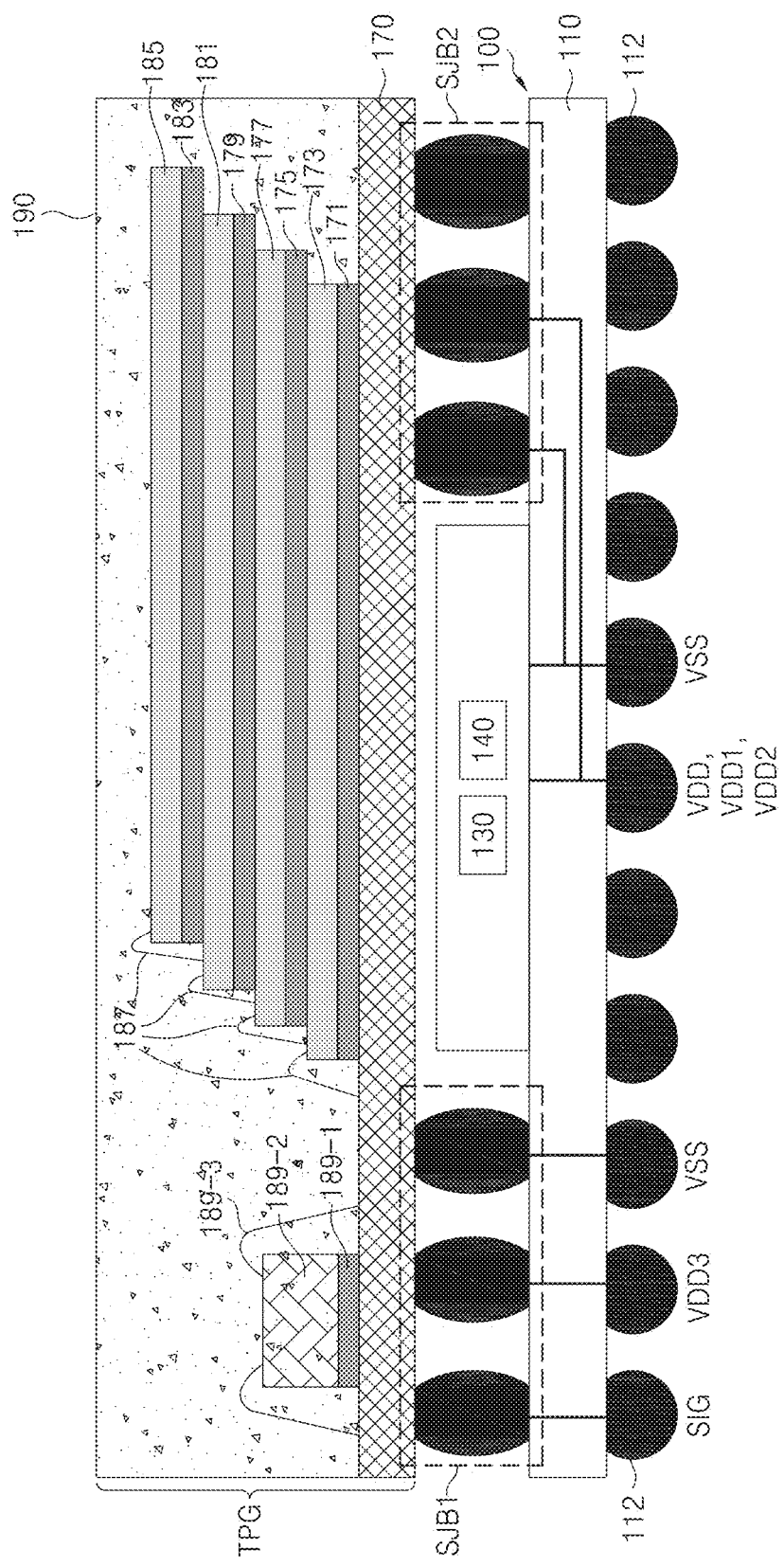
FIGS. 19 to 20 are cross-sectional views of package on packages including a bottom package and a top package according to some example embodiments of the inventive concepts.

FIG. 17 is a cross-sectional view when viewing a package on package including the bottom package 100A-1 and the top package TPG from an A-direction. That is, FIG. 17 is a front cross-sectional view for a package on package, and FIG. 19 is a lateral cross-sectional view for the package on package.

Figure 21:
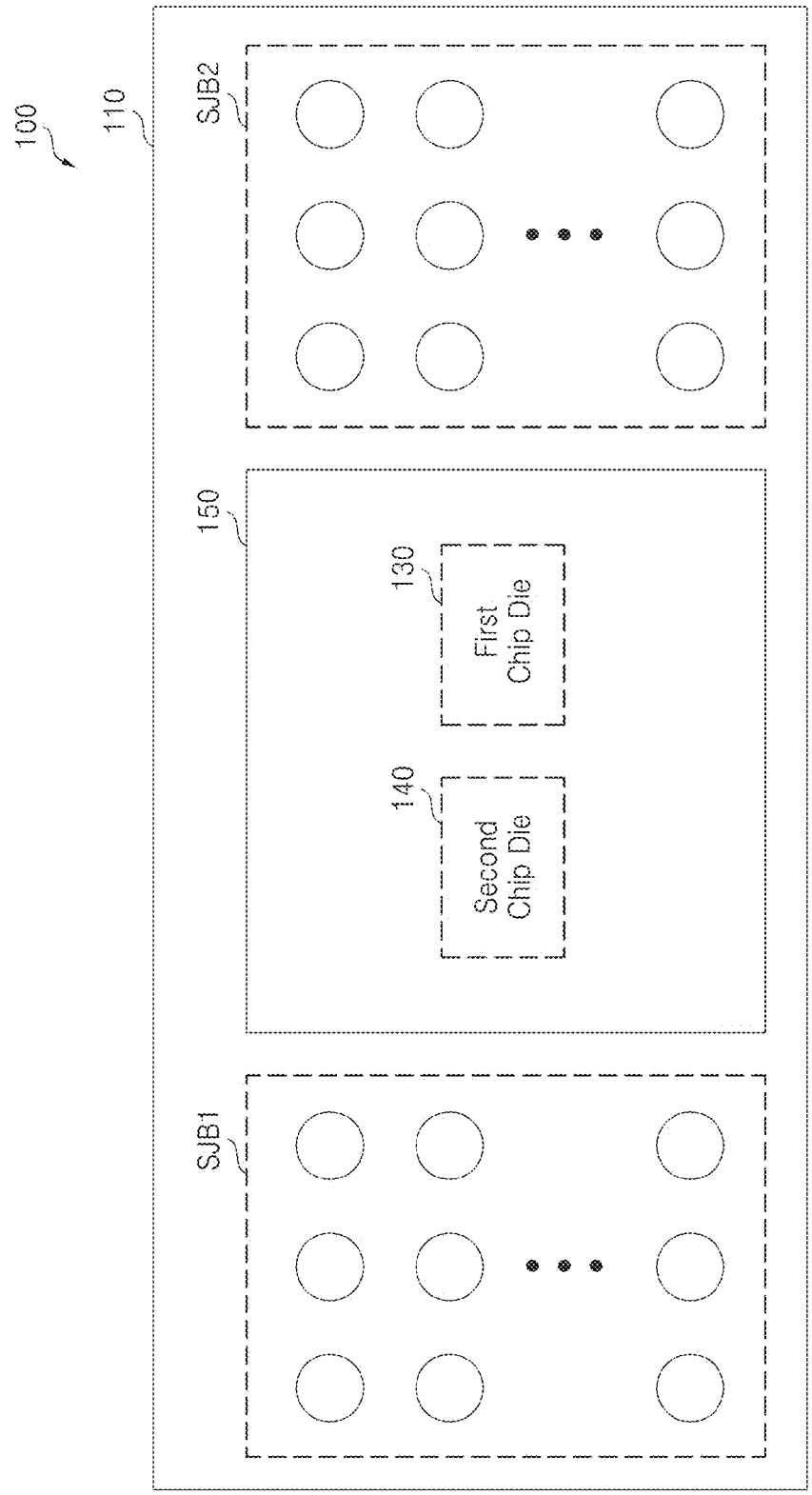
FIG. 21 is a plan view which shows an embodiment example of a first stack connection solder balls and second stack connection solder balls disposed around two facing sides of a bottom package according to some example embodiments of the inventive concepts.

FIG. 21 is a plan view which shows an embodiment example of first stack connection solder balls SJB1 and second stack connection solder balls SJB2 disposed around two facing sides of a bottom package. Referring to FIGS. 17 and 21, the first stack connection solder balls SJB1 and the second stack connection solder balls SJB2 may be formed only around two sides facing each other among four sides of the protective material 150 including the first chip die 130 and the second chip die 140. That is, the first stack connection solder balls SJB1 and the second stack connection solder balls SJB2 may be formed in a butterfly structure.

Referring to FIG. 17, pads for transmitting supply voltages (e.g., a third operation voltage VDD3 and the ground voltage VSS) and signals SIG necessary for operations of at least one of the third chip dies 173, 177, 181, and 185 included in the top package TPG and operations of the memory controller 189-2 may be pinned-out through at least two solder balls among the solder balls 112 through the first stack connection solder balls SJB1 and the first PCB 110.

Moreover, only pads for transmitting supply voltages (e.g., an operation voltage and a ground voltage) necessary for operations of at least one of the third chip dies 173, 177, 181, and 185 may be connected to metal lines in the first PCB 110 through at least two connection solder balls among the second stack connection solder balls SJB2. The operation voltage VDD, VDD1, or VDD2 and the ground voltage VSS may be supplied to at least one of the first chip die 130, the second chip die 140, and the third chip dies 173, 177, 181, and 185.

Figure 18:
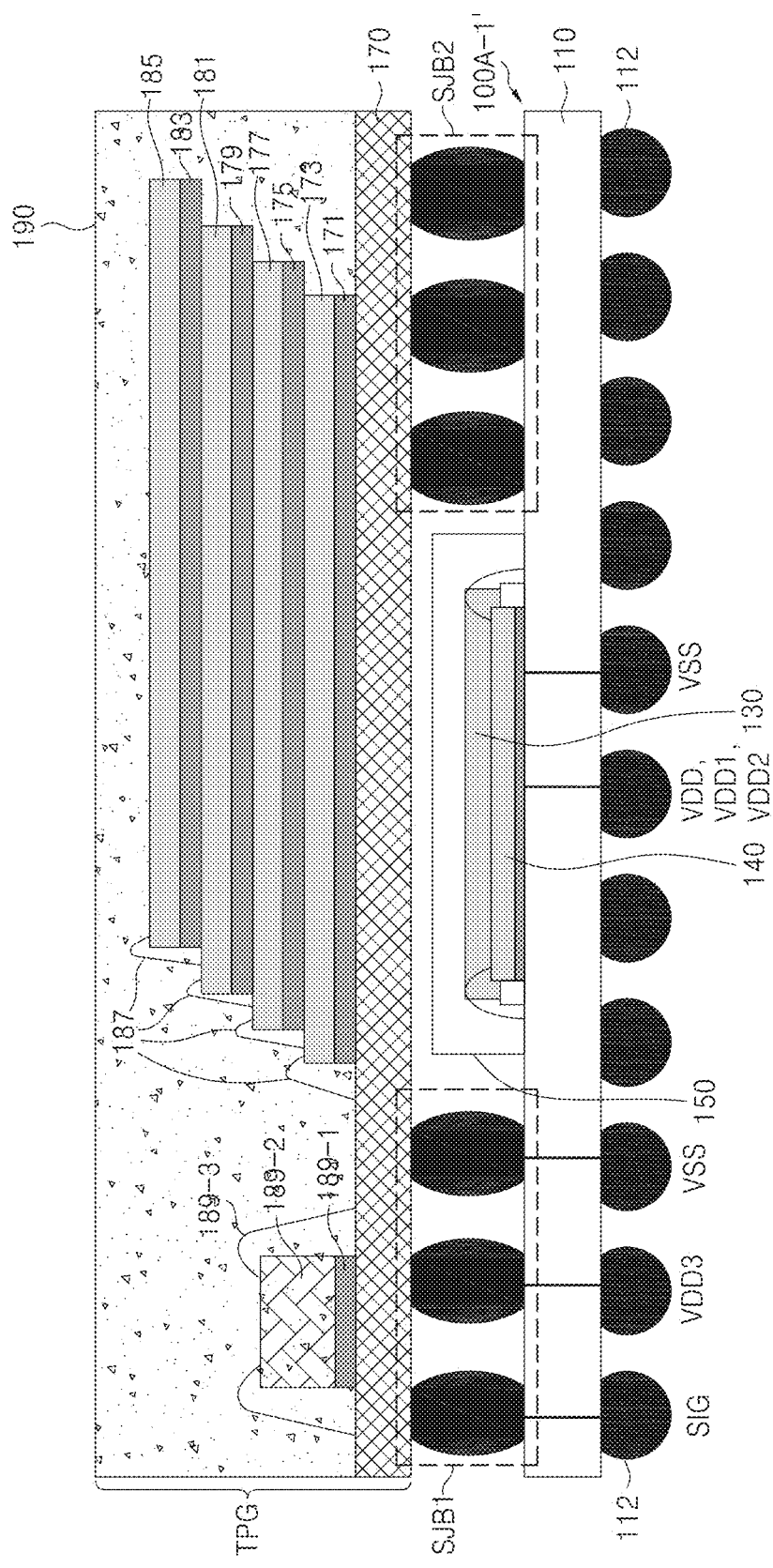

Referring to FIG. 18, the second stack connection solder balls SJB2 connected between a bottom package 100A-1' and the top package TPG may not transmit any operation voltages or any signals. At this time, the second stack connection solder balls SJB2 may be referred to as an electrical floating state. The operation voltage VDD, VDD1, or VDD2 and the ground voltage VSS may be supplied only to the first chip die 130 and the second chip die 140 through corresponding solder balls.

Each of the operation voltages VDD, VDD1, VDD2, and VDD3 in the present specification collectively refers to one or more operation voltages, and a solder ball which transmits each of the operation voltages VDD, VDD1, VDD2, and VDD3 collectively refers to one or more solder balls. Moreover, a solder ball which transmits the signals SIG refers to solder balls which transmit a plurality of signals.

Figure 20:
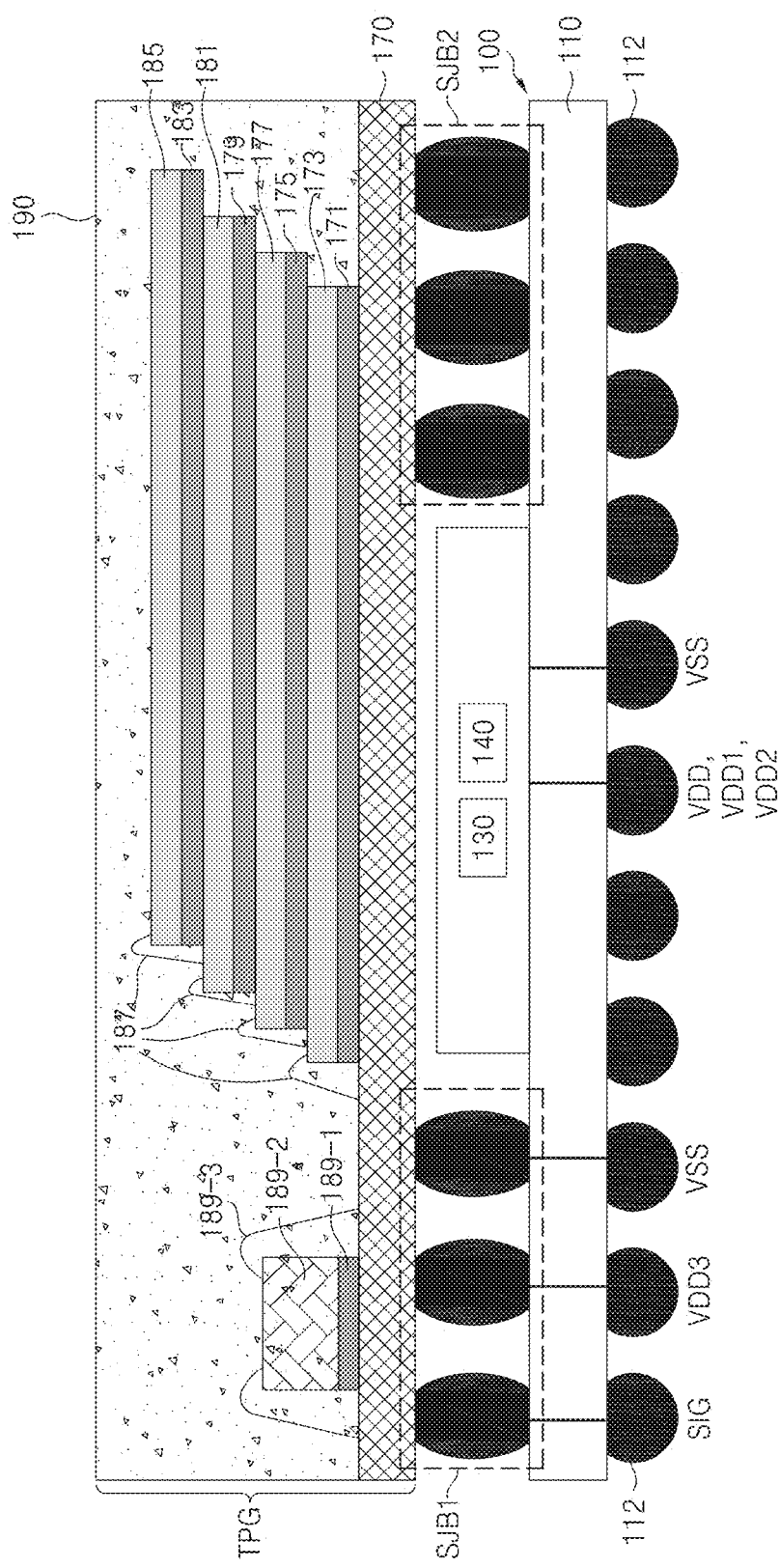

FIGS. 19 and 20 are cross-sectional views of package on packages including a bottom package and a top package according to some example embodiments of the inventive concepts.

A package on package may include a bottom package (100A to 100J, 100A-1, 100B-1, 100C-1, or 100D-1, collectively "100") including the first chip die 130 and the second chip die 140 described referring to FIGS. 1 to 14, and a top package TPG described referring to FIG. 15. According to some example embodiments, a structure of the bottom package to be included in a package on package may be variously changed according to a design specification on the package on package.

Referring to FIG. 19, only pads which transmit supply voltages (e.g., an operation voltage and a ground voltage) necessary for operations of at least one of the third chip dies 173, 177, 181, and 185 may be connected to metal lines in the first PCB 110 through at least two connection solder balls among the second stack connection solder balls SJB2.

At least two connection solder balls among the second stack connection solder balls SJB2 are not independently pinned out through solder balls of the first PCB 110. Accordingly, the operation voltage VDD, VDD1, or VDD2 and the ground voltage VSS may be supplied to both the bottom package 100 including the first chip die 130 and the second chip die 140 and the top package TPG at the same time.

Referring to FIG. 20, the second stack connection solder balls SJB2 connected between the bottom package 100 and the top package TPG may not transmit any operation voltages and any signals. Referring to FIGS. 17 to 20, all first pads which transmit the signals SIG necessary for operations of the third chip dies 173, 177, 181, and 185 and the memory controller 189-2 included in the top package TPG may be connected only to the first stack connection solder balls SJB1.

As shown in FIGS. 17 and 19, second pads which transmit the third operation voltage VDD3 and the ground voltage VSS (e.g., supply voltages) necessary for operations of the third chip dies 173, 177, 181, and 185 and/or the memory controller 189-2 included in the top package TPG may be connected to the first stack connection solder balls SJB1, and third pads which transmit supply voltages (at least one of VDD, VDD1, and VDD2, and the ground voltage VSS) necessary for operations of the third chip dies 173, 177, 181, and 185 and/or the memory controller 189-2 included in the top package TPG may be connected to the second stack connection solder balls SJB2. At this time, the number of the second pads may be more than the number of the third pads.

As shown in FIGS. 18 and 20, second pads which transmit the third operation voltage VDD3 and the ground voltage VSS (e.g., supply voltages) necessary for operations of the third chip dies 173, 177, 181, and 185 and the memory controller 189-2 included in the top package TPG may be connected only to the first stack connection solder balls SJB1, and the second stack connection solder balls SJB2 may maintain an electrically floating state. As shown in FIG. 21, the first stack connection solder balls SJB1 and the second stack connection solder balls SJB2 are disposed only around two facing sides. The signals SIG transmitted to the top package TPG or the signals SIG transmitted from the top package TPG may be transmitted only through the first stack connection solder balls SJB1.

Figure 22:
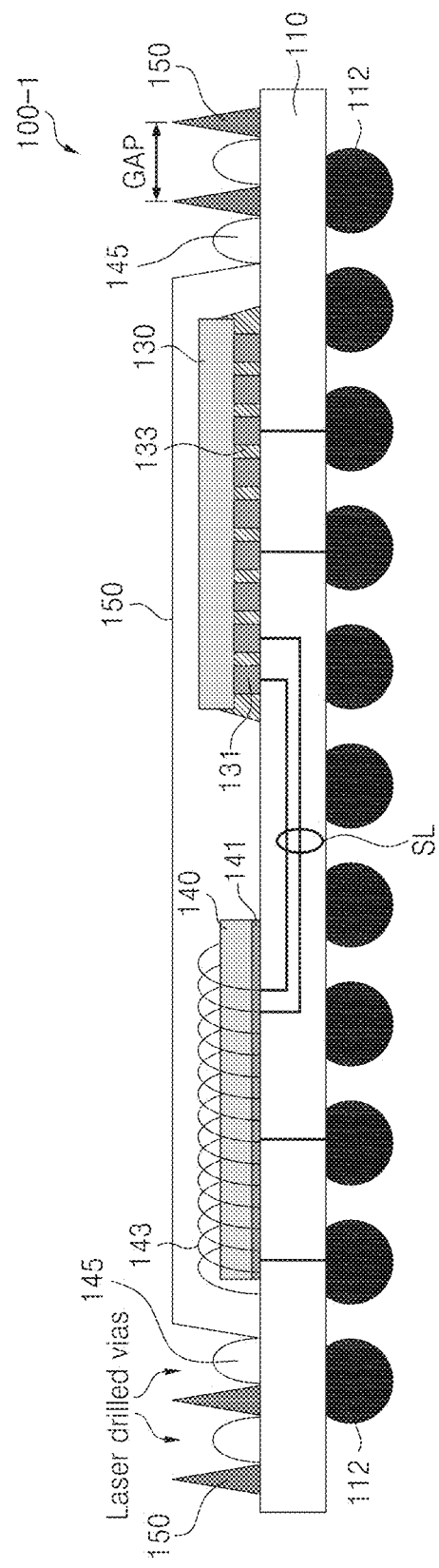
FIGS. 22 and 23 are cross-sectional views of bottom packages which include first stack connection solder balls and second stack connection solder balls exposed using a laser drill technology.
Figure 23:
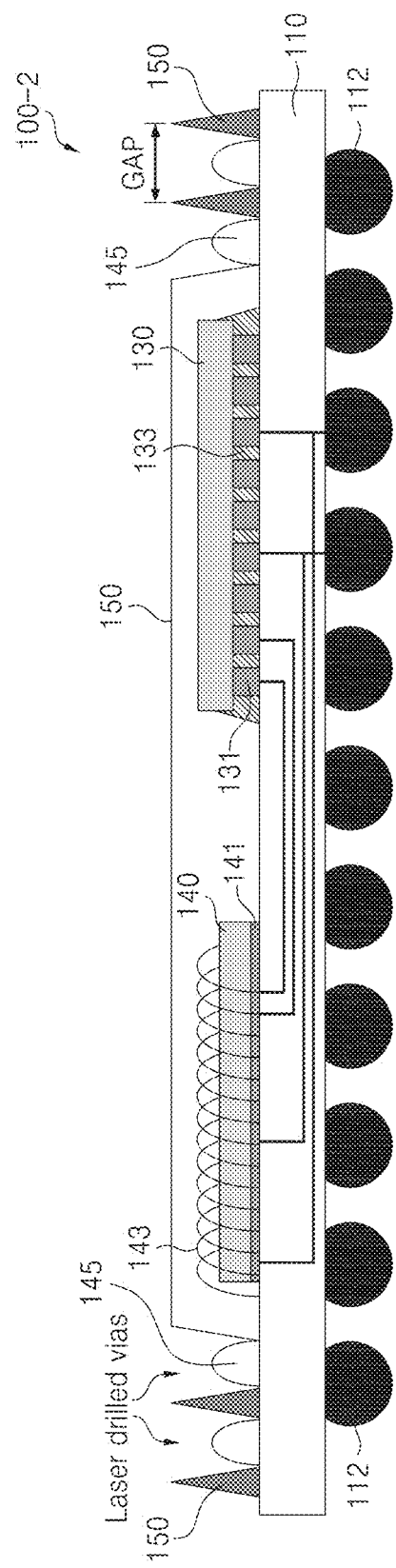

FIGS. 22 and 23 are cross-sectional views of bottom packages which include first stack connection solder balls and second stack connection solder balls exposed using a laser drill technology.

For bottom package 100-1, the first chip die 130 receives supply voltages input through corresponding first solder balls, and the second chip die 140 receives supply voltages input through corresponding second solder balls in FIG. 22. For bottom package 100-2, the first chip die 130 receives supply voltages input through corresponding common solder balls, and the second chip die 140 receives supply voltages input through the common solder balls in FIG. 23.

As shown in FIGS. 22 and 23, after the first chip die 130, the second chip die 140, solder balls 131, and wires 143, which are included in each of the bottom packages 100-1 and 100-2, are molded using the protective material 150, solder balls 145 which can be connected to the first stack connection solder balls SJB1 and the second stack connection solder balls SJB2 may be exposed using a laser drill via technology. Accordingly, the solder balls 145 exposed by laser drilled vias may be electrically connected to the first stack connection solder balls SJB1 and the second stack connection solder balls SJB2 by an infrared (IR) reflow. The solder balls 145 may be formed on a top surface of the first PCB 110.

Figure 24:
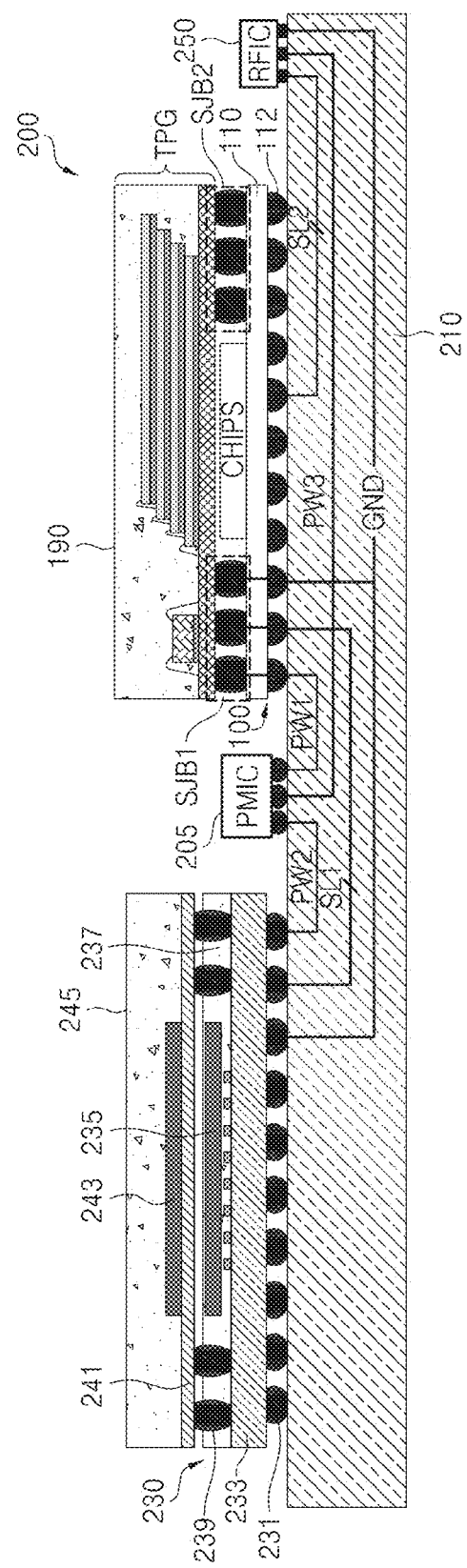
FIG. 24 is a cross-sectional view of a package assembly included in a mobile computing device according to some example embodiments of the inventive concepts.

FIG. 24 is a cross-sectional view of a package assembly included in a mobile computing device according to some example embodiments of the inventive concepts. Referring to FIGS. 1 to 24, a package assembly 200 included in a mobile computing device may include a system board 210, a package on package (or first package) which includes the bottom package 100 and the top package TPG, a power management integrated circuit (PMIC) 205, and a second package 230. For example, the system board 210 may perform a function of a PCB.

A mobile computing device described in the present specification may be embodied in a mobile phone, a smart phone, a tablet PC, a mobile internet device (MID), a wearable device or wearable computer, a lap-top computer, an internet of things (IoT) device, or an internet of everything (IoE) device.

A first package may be attached to the system board 210 through the solder balls 112. The PMIC 205 may be attached to the system board 210 through corresponding solder balls. The second package 230 may be attached to the system board 210 through solder balls 231.

First supply voltages PW1 output from the PMIC 205 may be supplied to at least one of the first stack connection solder balls SJB1 through first voltage lines embedded in the system board 210, corresponding solder balls among the solder balls 112, and the first PCB 110.

Second supply voltages PW2 output from the PMIC 205 may be supplied to the second package 230 through at least one of second voltage lines embedded in the system board 210 and the solder balls 231. Third supply voltages PW3 output from the PMIC 205 may be supplied to a wireless chip die 250 through third voltage lines embedded in the system board 210 and corresponding solder balls.

Signals output through corresponding connection solder balls among the first stack connection solder balls SJB1 may be transmitted to the second package 230 through signal lines SL1 embedded in the system board 210, and signals output from the second package 230 may be transmitted to corresponding connection solder balls among the first stack connection solder balls SJB1 through the signal lines SL1 embedded in the system board 210. The first chip die 130 included in the first package may transmit or receive signals to or from the wireless chip die 250 through signal lines SL2 embedded in the system board 210.

A ground line of each of the first package, the PMIC 205, the second package 230, and the wireless chip die 250 may be connected to a ground line GND embedded in the system board 210. A ground line of the first package may be connected to a ground line of the first chip die 130, a ground line of the second chip die 140, and a ground line of each of the third chip dies 173, 177, 181, and 185.

The second package 230 may include a third PCB 233 connected to the system board 210 through the solder balls 231, a fourth chip die 235 connected to the third PCB 233 through interconnections, a protective material 237 which protects the fourth chip die 235, and interconnections 239 which connect the third PCB 233 and a fourth PCB 241.

The interconnection 239 may refer to stack connection solder balls. According to some example embodiments, the fourth chip die 235 may be attached to the third PCB 233 in a flip-chip structure. According to some example embodiments, the fourth chip die 235 may be attached to the third PCB 233 using a die attach material. At this time, the fourth chip die 235 may transmit or receive signals to or from the third PCB 233 through wires. According to some example embodiments, the fourth chip die 235 may refer to an application processor (AP) chip die or a SoC; however, example embodiments are not limited thereto.

The second package 230 may further include a fifth chip die 243, and the fifth chip die 243 may be attached on the fourth PCB 241. According to some example embodiments, the fifth chip die 243 may refer to a volatile memory chip die or a non-volatile memory chip die. For example, the fifth chip die 243 may be embodied in a DRAM chip die.

According to some example embodiments, the fifth chip die 243 may be attached to the fourth PCB 241 in a flip-chip structure. According to some example embodiments, the fifth chip die 243 may be attached to the fourth PCB 241 using a die attach material. At this time, the fifth chip die 243 may transmit or receive signals to or from the fourth PCB 241 through wires. The second package 230 may further include a protective material 245 to protect the fifth chip die 243. According to some example embodiments, the second package 230 may be embodied in a package on package.

Each of the protective materials 237 and 245 may be embodied in an EMC. A space between the third PCB 233 and the fourth chip die 235 may be filled with an underfill material through a capillary underfill (CUF) process.

Figure 25:
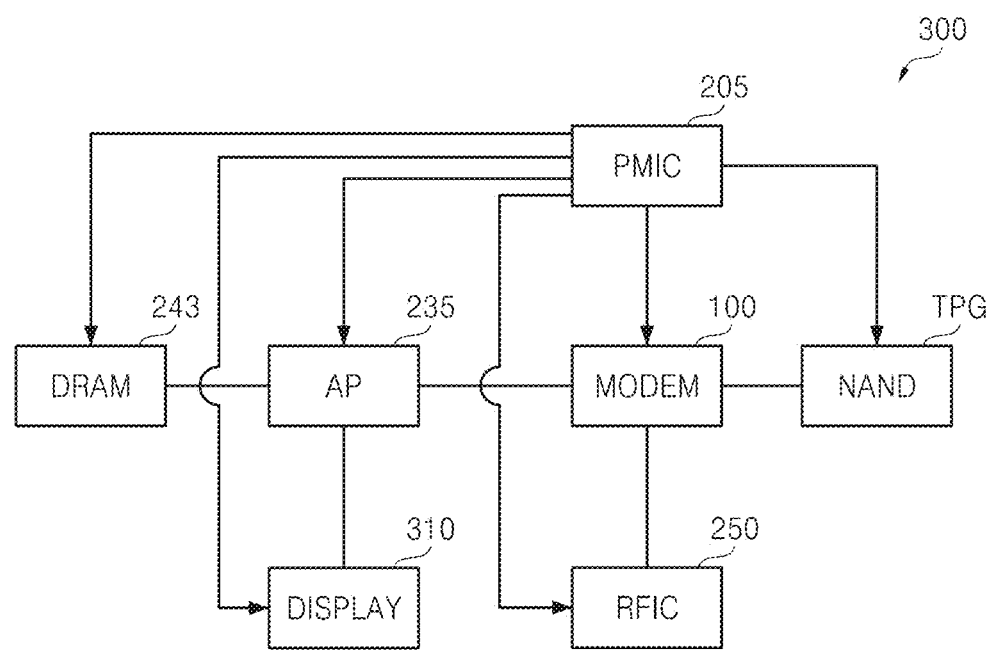
FIG. 25 is a block diagram of a mobile computing device which includes a package assembly shown in FIG. 24.

FIG. 25 is a block diagram of a mobile computing device which includes a package assembly shown in FIG. 24. Referring to FIGS. 24 and 25, a mobile computing device 300 may include the bottom package 100, the top package TPG, the PMIC 205, the fourth chip die 235 (e.g., application processor 235), the fifth chip die 243 (e.g., DRAM 243), the wireless chip die 250 (e.g., radio frequency integrated circuit (RFIC) 250), and a display 310. The PMIC 205 may supply a corresponding supply voltage to each of the bottom package 100, the top package TPG, the fourth chip die 235 (e.g., application processor 235), the fifth chip die 243 (e.g., DRAM 243), the wireless chip die 250 (e.g., RFIC 250), and the display 310.

A structure of the bottom package 100 and a structure of the top package TPG are as described referring to FIGS. 1 to 24. The fourth chip die 235 (e.g., application processor 235) may control a write operation and a read operation on the fifth chip die 243 (e.g., DRAM 243). The fourth chip die 235 (e.g., application processor 235) may transmit display data to be displayed in the display 310 to the display 310.

The fourth chip die 235 (e.g., application processor 235) may control an operation of the first chip die 130 and/or the second chip die 140 included in the bottom package 100. The fourth chip die 235 (e.g., application processor 235) may control an operation of the memory controller 189-2 and/or the third chip dies 173, 177, 181, and 185 included in the top package TPG. The fourth chip die 235 (e.g., application processor 235) may control an operation of the wireless chip die 250 (e.g., RFIC 250).

A package on package according to some example embodiments of the inventive concepts can dispose stack connection balls, which are used to stack a bottom package and a top package, only around two sides facing each other among sides of a protective material including chip dies attached to a printed circuit board of the bottom package. The package on package according to some example embodiments of the inventive concepts can connect all pads necessary for an operation of at least one chip die included in the top package only to first stack connection balls among the stack connection balls, thereby decreasing a size and a height of the package on package according to some example embodiments of the inventive concepts.

While some example embodiments of the inventive concepts have been particularly shown and described with reference to some example embodiments thereof, it will be understood by those of ordinary skill in the art that various changes in forms and details may be made therein without departing from the spirit and scope of the inventive concepts as defined by the following claims.

It should be understood that example embodiments described herein should be considered in a descriptive sense only and not for purposes of limitation. Descriptions of features or aspects within example embodiments should typically be considered as available for other similar features or aspects in other example embodiments.

What is claimed is:

1. A package on package, comprising:
   a first printed circuit board (PCB);
   a bottom package attached to the first PCB, the bottom package including a first chip die and a second chip die;
   a top package over the bottom package, the top package including a second PCB, a third chip die, and a memory controller, the third chip die and the memory controller attached to the second PCB, the third chip die including a flash-based memory chip die, the memory controller configured to control operation of the third chip die; and
   first stack connection solder balls and second stack connection solder balls which are electrically connected between the first PCB and the second PCB, and are formed only around two sides facing each other among sides of the bottom package,
   wherein all signals and at least some of supply voltages for operations of the third chip die and the memory controller are transmitted through the first stack connection solder balls.

2. The package on package of claim 1, wherein the first chip die comprises a modem chip die,
   wherein the second chip die comprises a dynamic random-access memory (DRAM) chip die or a pseudo static random-access memory (SRAM) chip die, and
   wherein the bottom package comprises a system in package (SiP).

3. The package on package of claim 1, wherein the first chip die is attached to the first PCB in a flip-chip structure through first bumps, and
   wherein the second chip die is attached to the first PCB in the flip-chip structure through second bumps.

4. The package on package of claim 1, wherein the first chip die is attached to the first PCB in a flip-chip structure through first bumps,
   wherein the second chip die is attached to the first PCB in the flip-chip structure through second bumps, and
   wherein an empty space between the first chip die and the first PCB and an empty space between the second chip die and the first PCB are filled with a capillary underfill (CUF) material.

5. The package on package of claim 1, wherein the first chip die is attached to the first PCB in a flip-chip structure through first bumps,
   wherein the second chip die is attached to the first PCB in the flip-chip structure through second bumps, and
   wherein an empty space between the first chip die and the first PCB, and an empty space between the second chip die and the first PCB, the first chip die, and the second chip die are encapsulated using a molded underfill (MUF) material.

6. The package on package of claim 1, wherein all supply voltages for the operations of the third chip die and the memory controller are transmitted only through the first stack connection solder balls.

7. The package on package of claim 6, wherein each of the second stack connection solder balls is in an electrically floating state.

8. The package on package of claim 1, wherein all signals for the operations of the third chip die and the memory controller and a portion of supply voltages for operations of at least one of the third chip die and the memory controller are transmitted through the first stack connection solder balls, and a remaining portion of the supply voltages for the operations of at least one of the third chip die and the memory controller are transmitted through the second stack connection solder balls.

9. The package on package of claim 8, wherein the remaining portion of the supply voltages input through respective solder balls attached to a bottom surface of the first PCB are transmitted to the bottom package and the second stack connection solder balls through the first PCB.

10. The package on package of claim 1, wherein the first chip die and the second chip die transmit or receive signals to or from each other only through signal lines formed in the first PCB.

11. A mobile computing device, comprising:
    a system board;
    a first package attached to the system board; and
    a power management integrated circuit (PMIC) attached to the system board and configured to supply first supply voltages to the first package through the system board;
    wherein the first package includes:
       a first printed circuit board (PCB);
       a bottom package attached to the first PCB, the bottom package including a first chip die and a second chip die;
       a top package over the bottom package, the top package including a second PCB, a third chip die, and a memory controller, the third chip die and the memory controller attached to the second PCB, the third chip die including a flash-based memory chip die, the memory controller configured to control operation of the third chip die; and
       first stack connection solder balls and second stack connection solder balls which are electrically connected between the first PCB and the second PCB, and are formed only around two sides facing each other among sides of the bottom package,
       wherein all signals for operations of the third chip die and the memory controller and all of the first supply voltages for the operations of the third chip die and the memory controller are transmitted only through the first stack connection solder balls.

12. The mobile computing device of claim 11, wherein the first chip die comprises a modem chip die,
wherein the second chip die comprises a dynamic random-access memory (DRAM) chip die or a pseudo static random-access memory (SRAM) chip die, and
wherein the bottom package comprises a system in package (SiP).

13. The mobile computing device of claim 11, further comprising:
a second package attached to the system board, the second package including an application processor chip die,
wherein the PMIC is configured to supply second supply voltages to the application processor chip die through the system board,
wherein the system board includes signal lines configured to transmit signals transmitted or received between the application processor chip die and the first package, and
wherein the signal lines are connected to corresponding stack connection solder balls among the first stack connection solder balls through the first PCB.

14. An electronic device, comprising:
a first printed circuit board (PCB);
a first chip die on the first PCB;
a second chip die on the first PCB;
a second PCB on the first and second chip dies;
at least one third chip die on the second PCB, the at least one third chip die including a flash-based memory chip die;
a memory controller on the second PCB, the memory controller configured to control operation of the third chip die;
first stack connection solder balls and second stack connection solder balls electrically connected between the first PCB and the second PCB,
wherein the first stack connection solder balls are on an opposite side of the first and second chip dies from the second stack connection solder balls, and
all signals and at least some of supply voltages for operations of the third chip die and the memory controller are transmitted through the first stack connection solder balls.

15. The electronic device of claim 14, wherein the first chip die is attached to the first PCB in a flip-chip structure through first bumps, and
wherein the second chip die is attached to the first PCB in the flip-chip structure through second bumps.

16. The electronic device of claim 14, wherein the first chip die is attached to the first PCB in a flip-chip structure through bumps,
wherein the second chip die is attached to the first PCB through wire bonding, and
wherein an empty space between the first chip die and the first PCB, the first chip die, and the second chip die are encapsulated using a molded underfill (MUF) material.

* * * * *